United States Patent
Garg et al.

(10) Patent No.: US 11,929,751 B1
(45) Date of Patent: Mar. 12, 2024

(54) PHASE-LOCKED LOOP REFERENCE CLOCK MANAGEMENT

(71) Applicant: TEXAS INSTRUMENTS INCORPORATED, Dallas, TX (US)

(72) Inventors: Ankit Garg, Bangalore (IN); Abhijit Patki, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 18/148,652

(22) Filed: Dec. 30, 2022

(51) Int. Cl.
*H03L 7/08* (2006.01)
*H03L 7/083* (2006.01)
*H03L 7/091* (2006.01)
*H03L 7/10* (2006.01)
*H03L 7/18* (2006.01)

(52) U.S. Cl.
CPC ............ *H03L 7/0807* (2013.01); *H03L 7/083* (2013.01); *H03L 7/091* (2013.01); *H03L 7/10* (2013.01); *H03L 7/18* (2013.01)

(58) Field of Classification Search
CPC ................................ H03L 7/0807; H03L 7/10
See application file for complete search history.

(56) References Cited

U.S. PATENT DOCUMENTS

| | | | | |
|---|---|---|---|---|
| 8,194,186 | B2 * | 6/2012 | Kouyama | H03L 7/183 348/484 |
| 2007/0005163 | A1 * | 1/2007 | Takahashi | H04S 7/00 700/94 |

* cited by examiner

*Primary Examiner* — Patrick O Neill
(74) *Attorney, Agent, or Firm* — Valerie M. Davis; Frank D. Cimino

(57) ABSTRACT

A device includes a phase-locked loop (PLL) having a reference input. The device has a storage element and a reference clock generator having an interface clock input, a reference clock output, and a programmable clock divider. The reference clock generator is coupled to the storage element. The reference clock output is coupled to the reference input. The reference clock generator is configured to change a divide ratio for the programmable clock divider based on a value in the storage element such that a frequency of the reference clock output remains unchanged when a frequency of the interface clock input changes.

20 Claims, 18 Drawing Sheets

CLOCK SCALING FACTOR REGISTER

| VALUE | CLOCK SCALING FACTOR |
|---|---|
| b0000 | IMPLEMENTATION-DEFINED |
| b0001 | 1 |
| b0010 | 2 |
| b0011 | 4 |
| b0100 | 8 |
| b0101 | 16 |
| b0110 | 32 |
| b0111 | 64 |
| b1000 | RESERVED |
| b1001 | RESERVED |
| b1010 | RESERVED |
| b1011 | RESERVED |
| b1100 | RESERVED |
| b1101 | RESERVED |
| b1110 | RESERVED |
| b1111 | RESERVED |

| | | | | | | | | |
|---|---|---|---|---|---|---|---|---|
| | MODE6 | DIVIDED CLOCK (MHz) | 19.2 | NA | NA | NA | NA | NA | NA |
| | | DIVIDE RATIO | 1 | NA | NA | NA | NA | NA | NA |
| | MODE5 | DIVIDED CLOCK (MHz) | 9.6 | 9.6 | NA | NA | NA | NA | NA |
| | | DIVIDE RATIO | 2 | 1 | NA | NA | NA | NA | NA |
| | MODE4 | DIVIDED CLOCK (MHz) | 4.8 | 4.8 | 4.8 | NA | NA | NA | NA |
| | | DIVIDE RATIO | 4 | 2 | 1 | NA | NA | NA | NA |
| | MODE3 | DIVIDED CLOCK (MHz) | 2.4 | 2.4 | 2.4 | 2.4 | NA | NA | NA |
| | | DIVIDE RATIO | 8 | 4 | 2 | 1 | NA | NA | NA |
| | MODE2 | DIVIDED CLOCK (MHz) | 1.2 | 1.2 | 1.2 | 1.2 | 1.2 | NA | NA |
| | | DIVIDE RATIO | 16 | 8 | 4 | 2 | 1 | NA | NA |
| | MODE1 | DIVIDED CLOCK (MHz) | 0.6 | 0.6 | 0.6 | 0.6 | 0.6 | 0.6 | NA |
| | | DIVIDE RATIO | 32 | 16 | 8 | 4 | 2 | 1 | NA |
| | MODE0 (DEFAULT) | DIVIDED CLOCK (MHz) | 0.3 | 0.3 | 0.3 | 0.3 | 0.3 | 0.3 | 0.3 |
| | | DIVIDE RATIO | 64 | 32 | 16 | 8 | 4 | 2 | 1 |
| 803 | | INTERFACE CLOCK (MHz) | 19.2 | 9.6 | 4.8 | 2.4 | 1.2 | 0.6 | 0.3 |
| 802 | | CLOCK SCALING FACTOR | 1 | 2 | 4 | 8 | 16 | 32 | 64 |
| 801 | | BASE CLOCK FREQUENCY (MHz) | 19.2 | 19.2 | 19.2 | 19.2 | 19.2 | 19.2 | 19.2 |

FIG. 8

PHASE-LOCKED LOOP REFERENCE CLOCK MANAGEMENT

CROSS REFERENCE TO RELATED APPLICATION

This application claims priority to India provisional patent application no. 20224106243, filed Nov. 2, 2022, incorporated herein by reference.

BACKGROUND

Electrical interface protocols specify the electrical signaling between two or more devices. The MIPI SoundWire® protocol, for example, is an audio interface that is directed to a double data rate interface. The SoundWire® protocol permits the transfer of audio data in both pulse-code modulation (PCM) and pulse-density modulation (PDM) formats over a multi-drop bus between a manager and one or more peripheral devices. The Soundwire® interface has multiple conductors including a conductor for an interface clock signal (referred to herein as the "interface clock") and one or more conductors for data and control bits. The manager generates and transmits the interface clock to the peripheral device(s). Each peripheral may include a phase-locked loop (PLL) to phase lock its own output clock to the interface clock provided by the manager. Per the Soundwire® protocol, the manager can change the frequency of the interface clock during run-time (on-the-fly).

SUMMARY

In one example, a device includes a phase-locked loop (PLL) having a reference input. The device has a storage element and a reference clock generator having an interface clock input, a reference clock output, and a programmable clock divider. The reference clock generator is coupled to the storage element. The reference clock output is coupled to the reference input. The reference clock generator is configured to change a divide ratio for the programmable clock divider based on a value in the storage element such that a frequency of the reference clock output remains unchanged when a frequency of the interface clock input changes.

BRIEF DESCRIPTION OF THE DRAWINGS

FIG. 6 is a base clock scaling factor register implemented in the peripheral device, in an example.

FIG. 8 is a table illustrating multiple modes implemented by the reference clock generator of FIG. 7, in an example.

DETAILED DESCRIPTION

Figure 1:
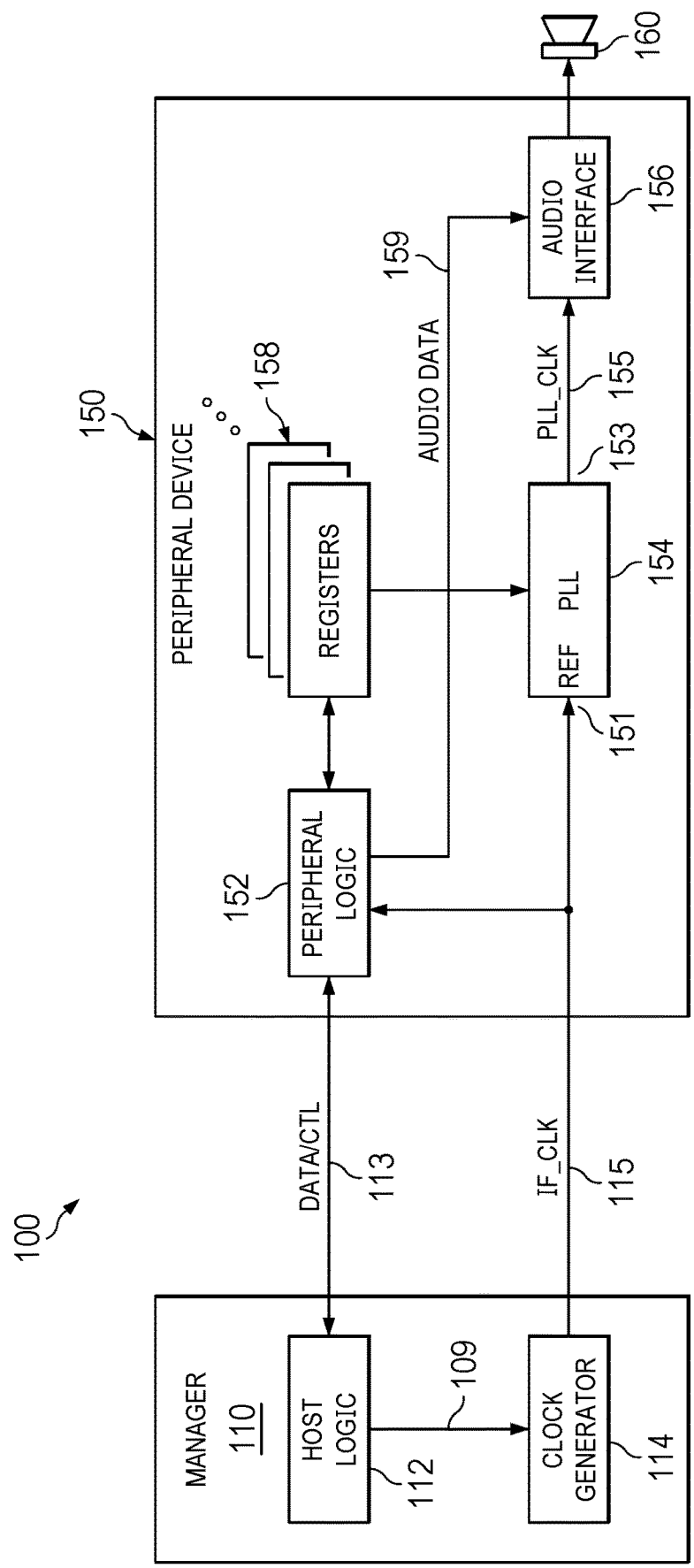
FIG. 1 is a block diagram of a system including a manager and a peripheral device, in which a phase-locked loop (PLL) in the peripheral device receives an interface clock from the manager as reference clock to the PLL, in an example.

The same reference numbers or other reference designators are used in the drawings to designate the same or similar (either by function and/or structure) features.

FIG. 1 is a block diagram of a system 100 in which the Soundwire® protocol is used. Although this description pertains to the Soundwire® protocol, the principles described herein can be applied to other types of protocols besides Soundwire® and even non-audio interfaces. System 100 includes a manager 110 coupled to a peripheral device 150 and a speaker 160 coupled to the peripheral device 150. The manager 110 may be coupled to more than one peripheral device 150 in some examples. In some embodiments, the manager 110 and peripheral device 150 may be fabricated as separate integrated circuits (ICs).

In this example, the manager 110 includes host logic 112 coupled to a clock generator 114. The peripheral device 150 includes peripheral logic 152, a PLL 154, and audio interface 156, and one or more storage elements 158. In the example of FIG. 1, the storage elements are registers 158. In another example, the storage elements may be implemented as memory. The audio interface 156 may include a finite state machine, microcontroller, a digital signal processor, or other type of digital circuit, and analog circuitry to drive an analog signal to the speaker 160. The electrical connectivity between the manager 110 and the peripheral device 150 includes conductors (e.g., wires, circuit board traces, etc.) 113 and 115. The host logic 112 provides data bits and control bits over conductor 113 to the peripheral logic 152. The clock generator 114 generates an interface clock, IF_CLK, which the manager 110 provides over conductor 115 to the peripheral device 150. The electrical connectivity between manager 110 and peripheral device 150 may have more than one conductor for data.

The host logic 112 is coupled to the clock generator 114 and provides a control signal 109. The control signal 109 causes the clock generator 114 to generate the interface clock IF_CLK at a particular frequency. The control signal 109 indicates the frequency to be generated. The host logic 112 is also coupled to the peripheral logic 152 via conductor 113. The clock generator 114 is coupled to a reference input of the PLL 154 and to the peripheral logic 152. The peripheral logic 152 is coupled to the storage elements 158 and to the audio interface 156. An output 153 of the PLL 154 is coupled to an input of the audio interface 156. An output of the audio interface 156 is coupled to an input of the speaker 160. The manager 110 (e.g., the host logic 112) transmits the data and control bits serially over conductor 113 to the peripheral device's peripheral logic 152, and the peripheral device may transmit data back to the manager 110 (the interface may be bi-directional). The serial stream of data and control bits may be parsed by the peripheral logic 152, and the peripheral logic 152 may perform write transactions to or read transactions from the registers 158 based on the control bits provided by the manager 110. The PLL 154 includes a reference clock input 151 and a clock output 153. In this example, the interface clock IF_CLK is provided to the PLL's reference clock input 151. Accordingly, the PLL 154 uses the interface clock as its reference clock to generate an output clock that is phase-locked to the interface clock (IF_CLK). The PLL's output clock is PLL_CLK 155, which may be provided to the audio interface 156 or divided down to a lower frequency clock to be provided to the audio interface. The audio interface 156 uses PLL_CLK and audio data 159 provided by the peripheral logic 152 to, for example, drive speaker 160. The speaker 160 may be a separate component coupled to the peripheral device 150 or may be integrated as part of the peripheral device 150.

The control bits from the manager 110 specify multiple parameters regarding the data bits and the interface clock, IF_CLK. By way of a brief example, the parameters specified by the control bits include a base clock frequency and a clock scaling factor for the interface clock, IF_CLK. The frequency of the interface clock IF_CLK is the base clock frequency divided by the clock scaling factor. The base clock frequency may be, 19.2 MHz, 24 MHz, 24.576 MHz, etc. The clock scaling factor may be 1, 2, 4, 8, etc. The peripheral device 150 uses the values indicative of the base clock frequency and the clock scaling factor provided by the manager 110 to generate a high frequency clock for logic in the audio interface 156.

The SoundWire® protocol permits the manager 110 to dynamically change the frequency of the interface clock IF_CLK by, for example dynamically changing the clock scaling factor. For example, if the manager 110 has previously specified a base clock frequency of 19.2 MHz and a clock scaling factor of 1, the frequency of the interface clock IF_CLK is 19.2 MHz. If the manager 110 then reduces the frequency of the interface clock in half (to 9.6 MHz), the manager 110 provides a new clock scaling factor of 2 to the peripheral device 150. Accordingly, the peripheral device can determine the new interface clock frequency by dividing the base clock frequency (19.2 MHz) by the updated clock scaling factor (2). The manager's host logic 112 communicates the information regarding the new clock scaling factor to the peripheral device 150 by updating register 158 and also directs the clock manager 114 to cut the frequency of the interface clock in half.

A problem occurs, however, when the frequency of interface clock IF_CLK changes suddenly. In the example of FIG. 0.1, the interface clock is the reference clock of the PLL 154. Any sudden change in the PLL's reference clock frequency may cause the PLL's output clock (PLL_CLK 155) to temporarily lose phase-lock with respect to the reference clock. If this happens, the PLL 154 may take some time to re-establish lock. During the period of time that the PLL's output clock is not in phase-lock with the reference clock, undesirable audible "pops" and "clicks" may be emitted from speaker 160. The examples described below address this problem.

Figure 2A:
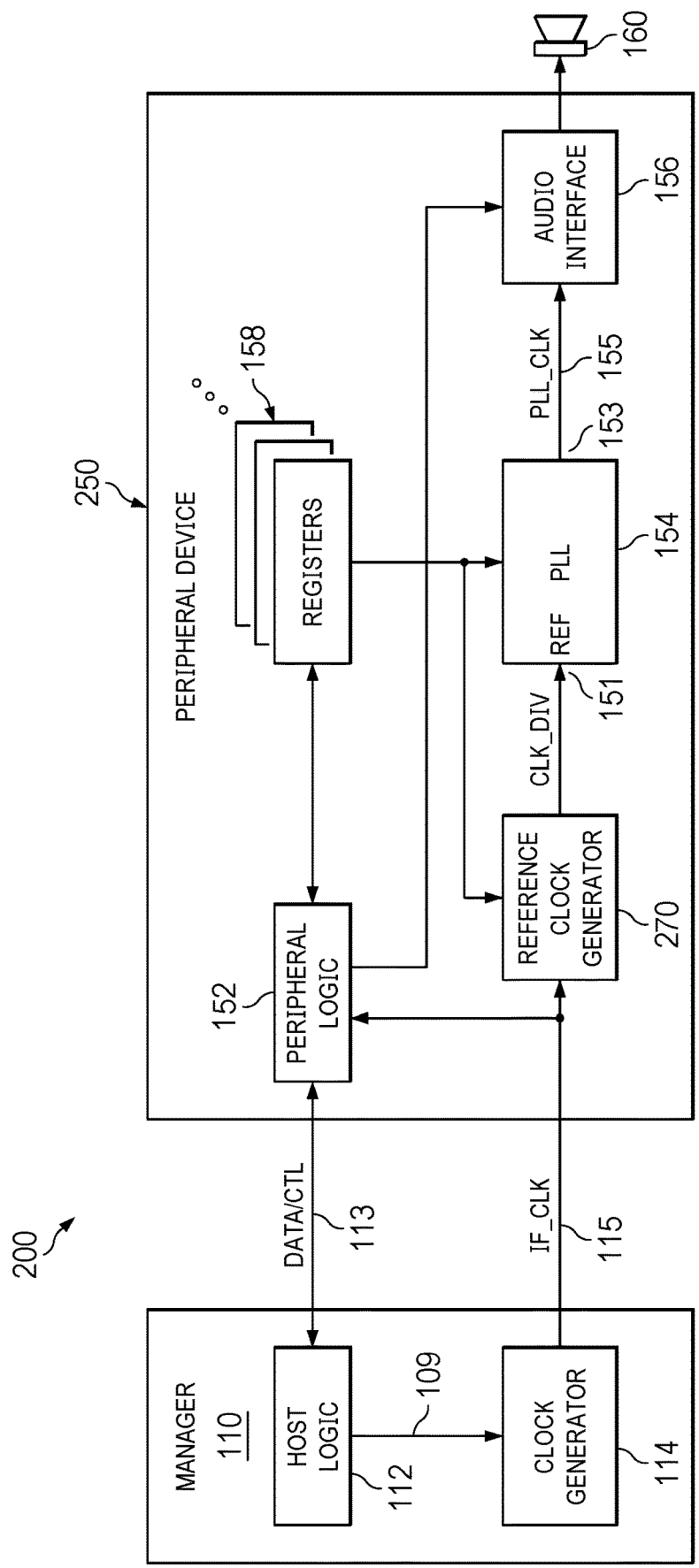
FIG. 2A is a block diagram of a system including a manager and a peripheral device, in which a reference clock generator in the peripheral device provides a constant frequency reference clock to the PLL despite changes in the frequency of the interface clock from the manager PLL, in an example.

FIG. 2A is a block diagram of a system 200 that addresses the problem described above in which the PLL may temporarily lose phase-lock responsive to a sudden change in the interface clock IF_CLK. In the example of FIG. 2A, the manager 110 is coupled to one or more peripheral devices 250 (only one shown). Each peripheral device 250 may be coupled to or may include the speaker 160. As described above, the manager 110 includes the host logic 112 coupled to the clock generator 114. The peripheral device 250 includes the PLL 154, the audio interface 156, the registers 158 (or other type of storage elements such as memory), peripheral logic 152, and a reference clock generator 270. The reference clock generator 270 is coupled between the clock generator 114 of the manager 110 and the reference clock input 151 of the PLL 154. The host logic 112 is coupled via conductor 113 to the peripheral logic 152. The clock generator 114 is coupled to the peripheral logic 152 and to an input of the reference clock generator 270. An output of the reference clock generator 270 is coupled to the reference input 151 of the PLL 154. The peripheral logic 152 is coupled to the storage elements 158 and to the audio interface 156. As described above, the output 153 of the PLL 154 is coupled to the input of the audio interface 156. The output of the audio interface 156 is coupled to the input of the speaker 160.

The reference clock generator 270 divides down the frequency of the interface clock IF_CLK by a factor that is based on one or more values from registers 158. As described below, the reference clock generator 270 includes a programmable frequency divider that advantageously maintains a constant frequency for the divided clock CLK_DIV even if the manager 110 changes the frequency of the interface clock IF_CLK. One or more values in registers 158 are used by the reference clock generator 270 to divide the potentially changing frequency of the interface clock to maintain a constant frequency for the divided clock CLK_DIV. The divided clock CLK_DIV is the reference input to the PLL 154 (Divided clock CLK_DIV may be further divided by another constant divide value also to generate the reference input to the PLL 154). Because the frequency of the divided clock CLK_DIV remains constant (despite frequency changes of the interface clock IF_CLK), the loss of phase-lock described above is generally avoided.

Figure 2B:
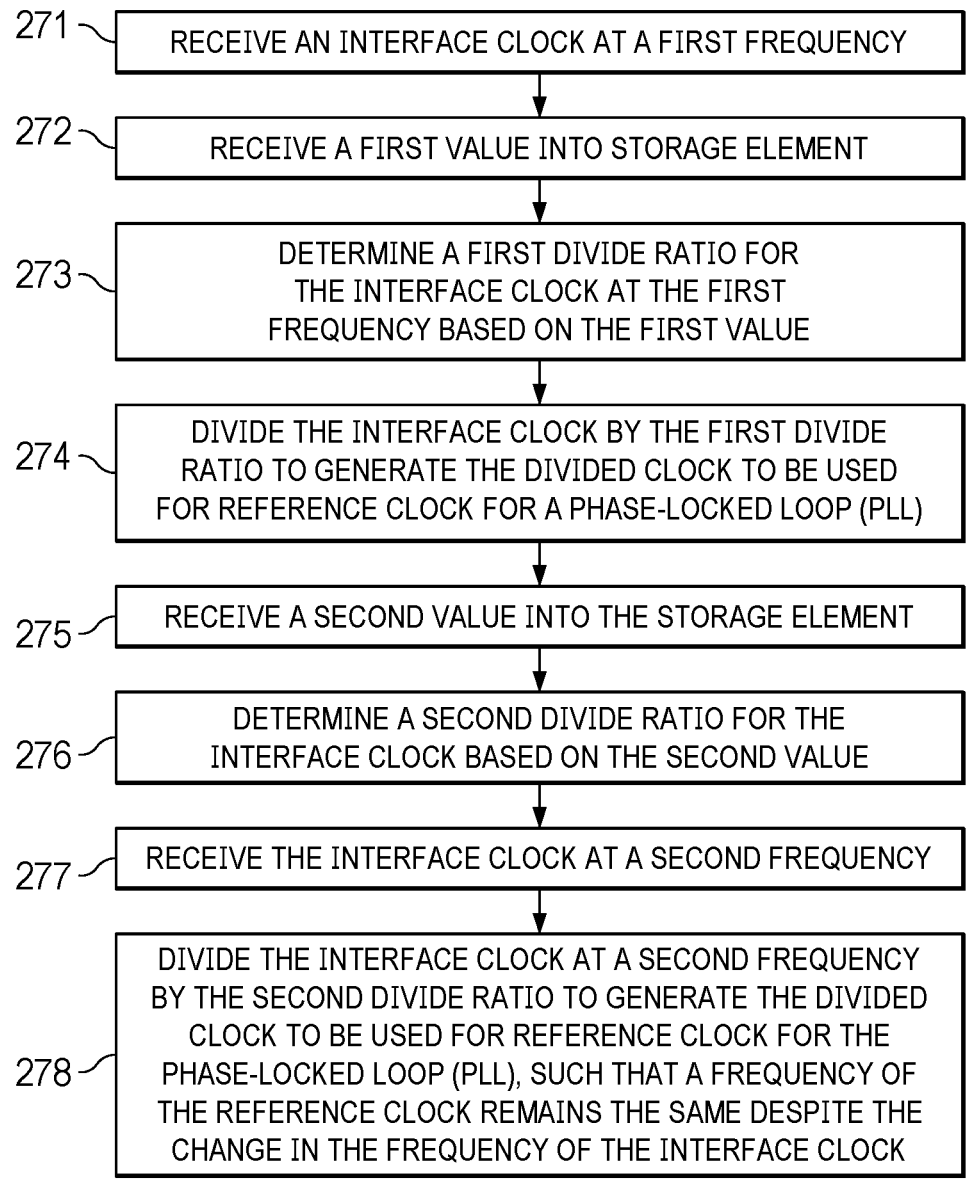
FIG. 2B is a flow diagram illustrating an example method of operation of the peripheral device of FIG. 2A.

FIG. 2B is a flow diagram illustrating an example method of operation of the peripheral device 250. The flow diagram of FIG. 2B includes blocks 271-278. At block 271, the reference clock generator 270 receives an interface clock IF_CLK at a first frequency. At block 272, one of the registers 158 receives a first value. The first value may include any one or more of the number of rows of an interface frame, the number of columns of an interface frame, a clock scaling factor (such values are described below), etc. At block 273, the reference clock generator 270 determines a first divide ratio for the interface clock at the first frequency based on the first value received in block 272. Examples of the determination of the divide ratio are provided below. At block 274, the reference clock generator 270 implements the first divide ratio in a programmable clock divider circuit to divide the interface clock by the first divide ratio to produce a divided clock to be used as a reference clock for the PLL 154.

The manager 110 may change the frequency of the interface clock IF_CLK from the first frequency to a second frequency. Accordingly, the reference clock generator 270 receives (block 275) a second value into the storage element. The second value received in block 275 may be an updated version of the first value in block 272. At block 276, the reference clock generator 270 determines a second divide ratio for the interface clock based on the second value received in step 275. At block 277, the reference clock generator 270 receives the interface clock IF_CLK at the second frequency. At block 278, the reference clock generator 270 implements the second divide ratio in the programmable clock divider circuit to divide the interface clock by the second divide ratio to produce a reference clock for the PLL 154. The reference clocks to the PLL produced in blocks 274 and 278 have the same frequency despite the change in the interface clock from the first frequency to the second frequency.

Data and control bits are transferred between the manager 110 (e.g., host logic 112) and the peripheral device 250 (peripheral logic 152). The serial stream of data and control bits may be parsed by the peripheral logic 152. The peripheral logic 152 may perform write transactions to or read transactions from the registers 158 based on the control bits provided by the manager 110. The interface clock IF_CLK 115 is provided to both the peripheral logic 152 and the reference clock generator 270.

Figure 3:
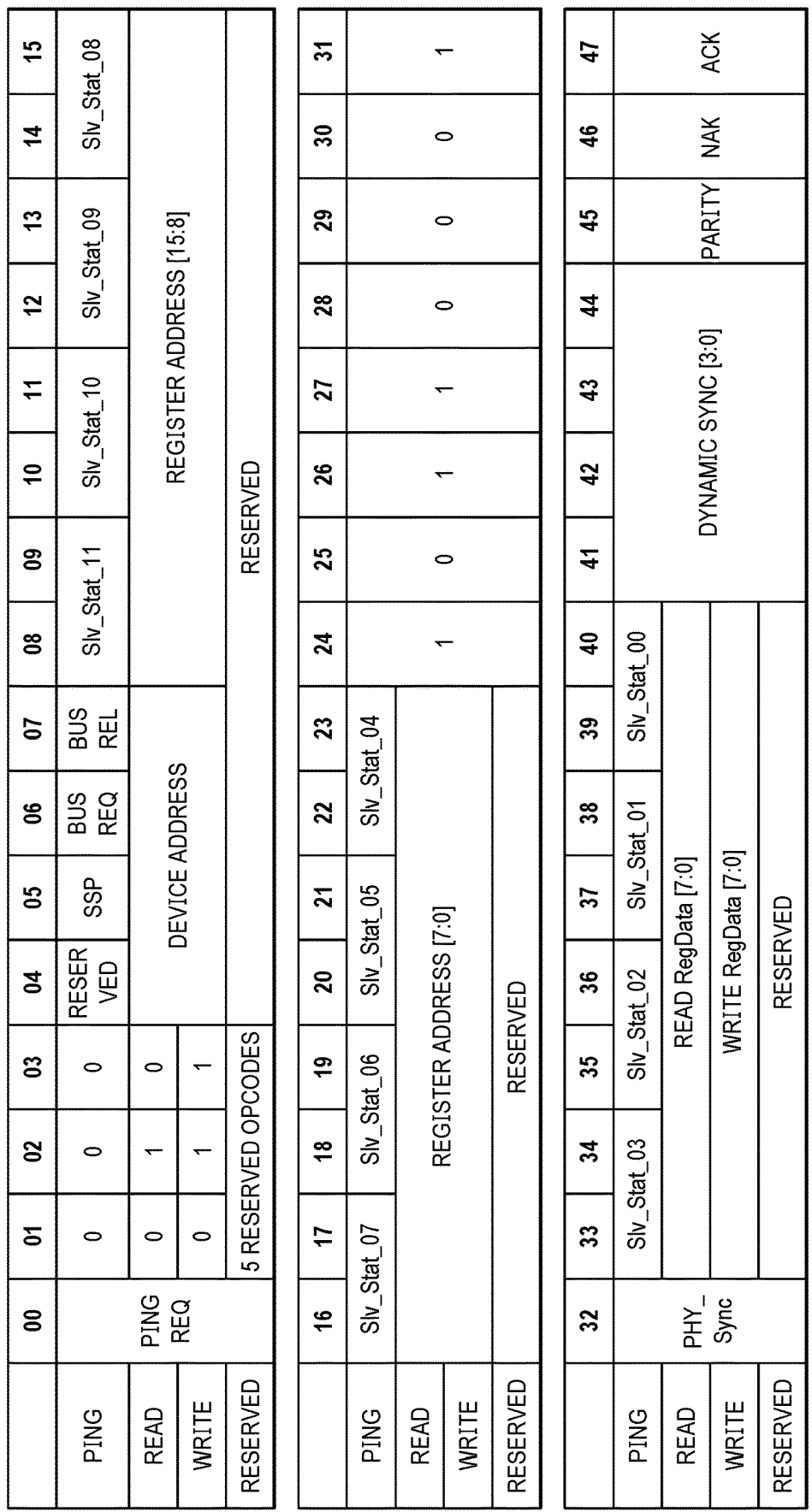
FIG. 3 is an example of a control word provided across the interface between the manager and the peripheral device.

The manager 110 may transmit a control word interleaved among the data bits on conductor 113 to the peripheral logic 152 within the peripheral device 250. FIG. 3 is an example of a control word 300. The control word 300 in this example is consistent with the SoundWire® protocol. The illustrative control word 300 is a 48-bit word numbered bit 00 to bit 47. Bits [01:03] include an opcode which may specify that a ping, read, or write is to be performed. Bit 05 is the Stream Synchronization Point (SSP) bit, which can be set to a logic '1' to mark the end of an interface frame as the stream synchronization point by the manager 110. For a read or write, bits [04:7] contain the address of the target peripheral device 250. The address of the particular register 158 being written to or read from by the manager 110 is contained in bits [08:23]. For a read or write transaction, read or write data is included in bits [33:40]. Bit 46 is a negative acknowledge (NAK) bit. Bit 47 is the acknowledge (ACK) bit. The combination of the NAK and ACK bits 46 and 47 may encode any of multiple responses such as, for example (per the Soundwire® protocol), Command_Aborted (the command did not complete correctly), Command_OK (read or write command completed without error), and Command_ignored (no device is responding to the command). The Command_Aborted response may be encoded as NAK being a logic 1 and ACK being either a logic 0 or a logic 1. The Command_OK response may be encoded as NAK being a logic 0 and ACK being a logic 1. The Command_Ignored response may be encoded as both NAK and ACK being logic 0.

In one example and as further described below, registers 158 include a base clock frequency register, a clock scaling factor register, a frame control register, and a sample interface register. In a further example, the registers 158 include two banks (e.g., active and shadow banks for some registers such as the clock scaling factor register, the frame control register, and the sample interval register). The bank which is being used for controlling the current operation of peripheral device is called the active bank and the other bank which is not used to control the current operations is called the shadow bank and thus the manager 110 can write values to the peripheral device's shadow bank registers without immediately affecting operation of the peripheral device decided based on the active bank registers. Registers other than those mentioned above may also have both active and shadow banks. In one example, per the Soundwire® protocol, the base clock frequency register does not have a shadow counterpart register. The shadow registers become the active registers upon, for example, the manager 110 writing to a shadow bank of a frame control register in the peripheral device. The register bank which currently controls the operations in the peripheral device is called the current bank which is the same as active bank. When the manager 110 writes to the active bank of the frame control register in the peripheral device, then there will be no bank switch and the bank which was the active bank earlier will remain the active bank after this write also. However, when the manager 110 writes to the shadow bank of the frame control register in the peripheral device, then a bank switch will happen at the interface frame boundary (e.g., the shadow bank will become the active bank and active bank will become shadow bank). The bank which will become the active bank at the interface frame boundary after a write by the manager to the frame control register is called the next bank. If there is no write to the frame control register, then the next bank will be the same as the current bank. "Current" and "next" terms are used for specific registers, for example, the next clock scaling factor means the value of clock scaling factor from the next bank which will become the active bank at the interface frame boundary.

The sample interval register is programmed by the manager 110 to include the value of the sample interval. The sample interval refers to the number of bits in each audio frame. An audio frame may include, for example, 192 bits, and thus the sample interval in this example is 192. The size of the sample interval may be changed by the manager 110 on the fly.

Figure 4:
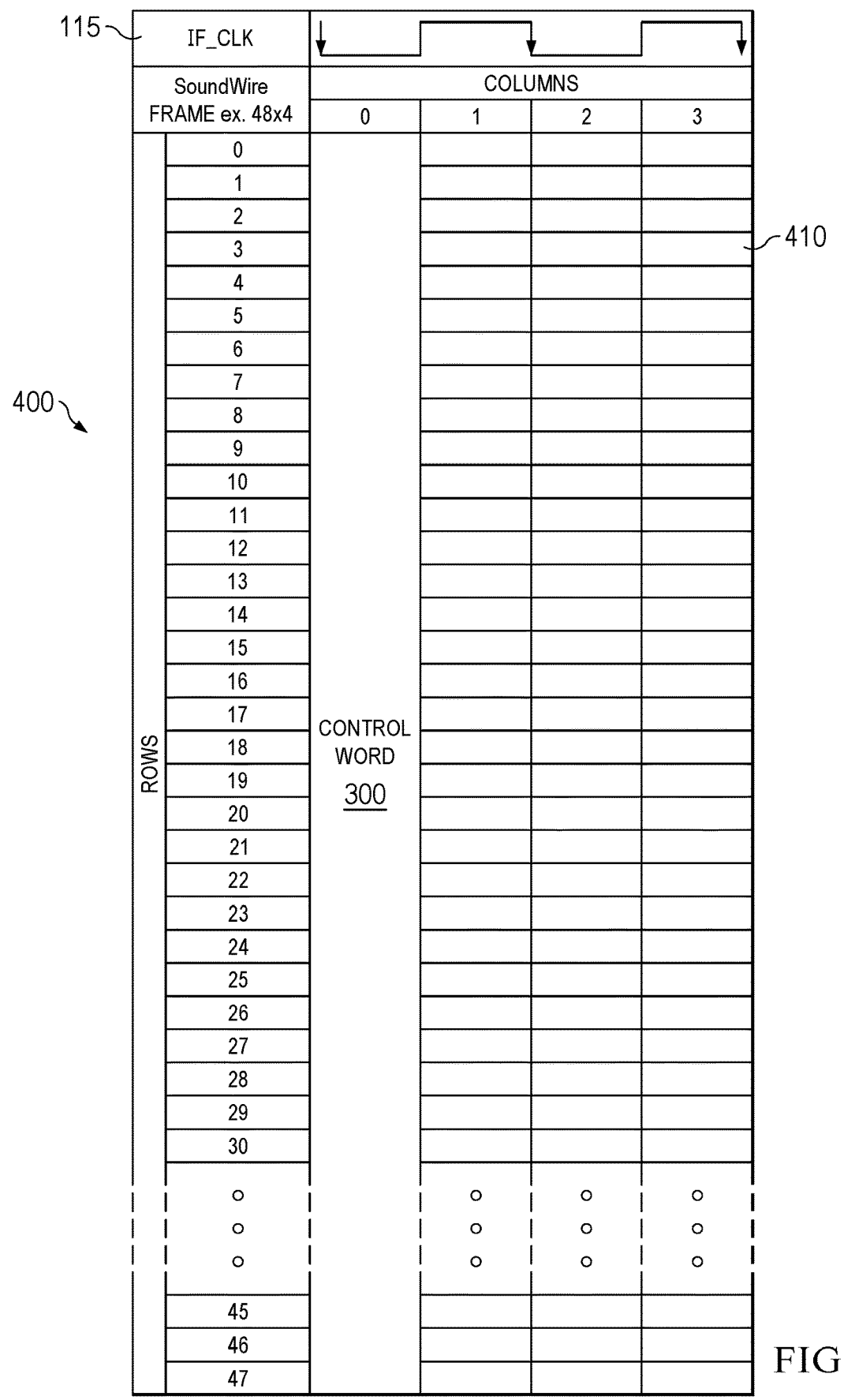
FIG. 4 is an example of an interface frame provided across the interface between the manager and the peripheral device.

The frame control register includes information that indicates the "shape" of an interface frame. Interface frames are communicated between the manager 110 and the peripheral device 250. In one example, the interface frames are consistent with the Soundwire® protocol. The interface frames, however, may be consistent with other protocols besides the Soundwire® protocol. Each interface frame includes a number of rows and a number of columns. The number of rows and the number of columns are included in a control word sent by the manager 110 to be written to the frame control register. FIG. 4 shows an example interface frame 400 consistent with the Soundwire® protocol. The interface frame 400 in the example of FIG. 4 includes 48 rows (numbered 0 through 47) and four columns (numbered 0 through 3). Each cell 410 represents a single bit. Column 0 includes the bits of the control word 300, and columns 1 through 3 may include data bits (e.g., audio data). The serial stream of bits from the manager 110 form the interface frame 400 starting with row 0. The first bit (a control word bit) is for column 0. The second bit is for column 1. The third bit is for column 2. The fourth bit is for column 3. The fifth bit is for column 0 of row 1, and so on. The bits of the sample interval occupy rows and columns (of at least a portion of an interface frame (and may span across multiple interface frames) The peripheral logic 152 recovers the data bits. If the data bits are audio bits, the peripheral logic 152 transmits the audio bits to the audio interface for conversion to an analog signal for the speaker 160.

The number of rows of an interface frame 400 range from 48 to 256 with 23 different values from 48 to 256 (e.g., 48, 50, 60, 64, 72, etc.). For 23 different values for rows, 5 bits are used to encode the number of rows and are written through the control word and stored by the peripheral logic 152 in the frame control register. The number of columns of an interface frame include, per the Soundwire® protocol, 2, 4, 6, 8, 10, 12, 14, and 16 columns. For eight different values for columns, 3 bits are written through the control word and stored by the peripheral logic 152 in the frame control register to encode the number of columns. Accordingly, in one example of a write transaction for a frame control register, the manager 110 encodes the number of rows and the number of columns in the control word's eight bits of write data (bits [33:40], FIG. 3) with bits [33:37] encoding the number of rows and bits [38:40] encoding the number of columns. Tables I and II below are examples of the mapping between the encoded values of the number of rows/columns and the corresponding decimal number of rows/columns.

TABLE 1

ROW ENCODING

| Encoded Value (decimal) | Number of Rows (decimal) |
| --- | --- |
| 0 | 48 |
| 1 | 50 |
| 2 | 60 |
| 3 | 64 |
| 4 | 75 |
| 5 | 80 |
| 6 | 125 |
| 7 | 147 |
| 8 | 96 |
| 9 | 100 |
| 10 | 120 |
| 11 | 128 |
| 12 | 150 |
| 13 | 160 |
| 14 | 250 |
| 15 | Reserved |
| 16 | 192 |
| 17 | 200 |
| 18 | 240 |
| 19 | 245 |
| 20 | 72 |
| 21 | 144 |
| 22 | 90 |
| 23 | 180 |
| 24-31 | Reserved |

TABLE II

COLUMN ENCODING

| Encoded Value (decimal) | Number of Columns (decimal) |
| --- | --- |
| 0 | 2 |
| 1 | 4 |
| 2 | 6 |
| 3 | 8 |
| 4 | 10 |
| 5 | 12 |
| 6 | 14 |
| 7 | 16 |

The peripheral device may store the encoded values for the numbers of rows and columns in the frame control register. Such encoded values are subsequentially decoded as binary equivalents of the decimal values shown in TABLES I and II, with 9 bits used for the number of rows (row_size[8:0]) and 5 bits used for the number of columns (col_size[4:0]).

Figure 5:
FIG. 5 is a base clock frequency register implemented in the peripheral device, in an example.

FIG. 5 is an example of the base clock frequency register 500 (one of registers 158) per the Soundwire® protocol. The values in the base clock frequency register 500 may range from b000 (binary) to b111 (decimal 0 through 7). The meaning of each binary value is illustrated in column 502 in FIG. 5. The value b001 means a base clock frequency of 19.2 MHz. The value b010 means a base clock frequency of 24 MHz. The value b011 means a base clock frequency of 24.576 MHz. The value b100 means a base clock frequency of 22.5792 MHz. The value b101 means a base clock frequency of 32 MHz. Binary value b000 refers to an 'unknown' (unspecified) base clock frequency. Binary value b111 can be used to encode an implementation-defined frequency.

FIG. 6 is an example of the clock scaling factor register 600 (one of registers 158) in accordance with the Soundwire® protocol. The values in the clock scaling factor register 600 range from b0001 to b0111. The meaning of each binary value is illustrated in column 602. The value b0001 means a clock scaling factor of 1. The value b0010 means a clock scaling factor of 2. The value b0011 means a clock scaling factor of 4. The value b0100 means a clock scaling factor of 8. The value b0101 means a clock scaling factor of 16. The value b0110 means a clock scaling factor of 32. The value b0111 means a clock scaling factor of 64.

The host logic 112 provides a control signal 109 (FIG. 2A) to the clock generator 114, which causes the clock generator 114 to generate the interface clock IF_CLK at a particular frequency (the control signal 109 indicates the frequency to be generated). The host logic 112 writes a base clock frequency value and a clock scaling factor value corresponding to the base clock frequency and the clock scaling factor (per the tables of FIGS. 5 and 6) via a control word into the corresponding registers within the peripheral device 250. Peripheral logic 152 receives the control word and stores the values in the corresponding registers. The interface clock frequency is the base clock frequency divided by the clock scaling factor. For example, for a base clock frequency of 19.2 MHz and a clock scaling factor of 2, the frequency of the interface clock IF_CLK will be 9.6 MHz (19.2 MHz divided by 2).

Figure 7A:
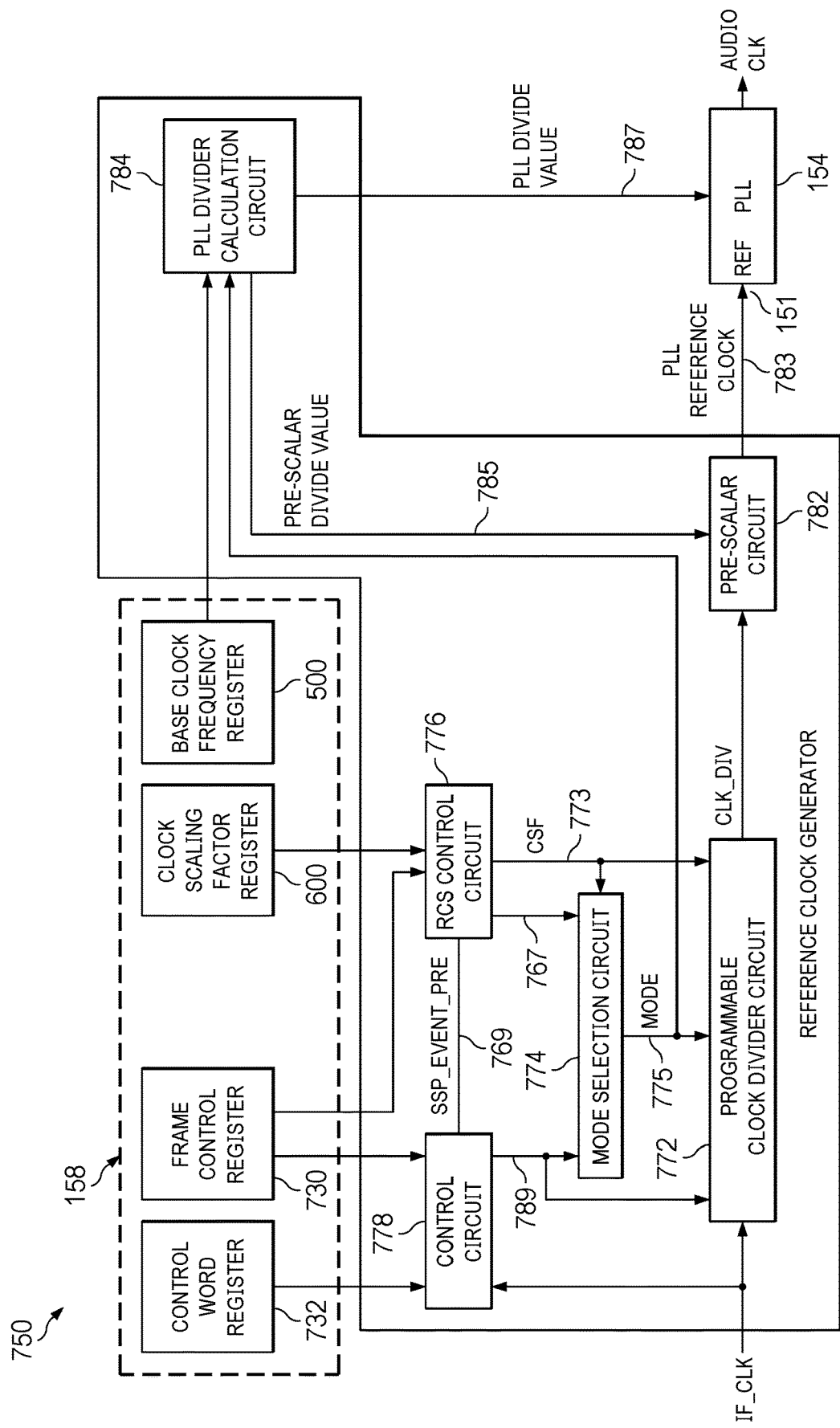
FIG. 7A is a schematic diagram of a peripheral device including a reference clock generator, in an example.

FIG. 7A is a block diagram of at least a portion of a peripheral device 750 in accordance with an embodiment. The peripheral device 750 is an example of peripheral device 250. The peripheral device 750 includes the registers 158, a pre-scalar circuit 782, the PLL 154, and a reference clock generator 770. Reference clock generator 770 is an example implementation of the reference clock generator 270 in FIG. 2A, and includes a programmable clock divider circuit 772, a mode selection circuit 774, a row/column/scaling factor (RCS) control circuit 776, a control circuit 778, a pre-scalar circuit 782, and a PLL divider calculation circuit 784.

In this example, registers 158 include the base clock frequency register 500, the clock scaling factor register 600, a frame control register 730, and a control word register 732. The sample interval register is not shown or used in this embodiment for the PLL reference clock generation. The encoded number of rows and columns from the control word are stored in the frame control register 730 (which may include an active and a shadow pair of frame control registers). The control word register 732 may store other information from the control word such as the SSP, ACK, and NAK bits.

In this example, the control word register 732 and the frame control register 730 are coupled to the control circuit 778. Frame control register 730 and the clock scaling factor register 600 are coupled to the RCS control circuit 776. The control circuit 778 is coupled to the mode selection circuit 774 and to the programmable clock divider circuit 772. The RCS control circuit 776 also is coupled to the mode selection circuit 774 and to the programmable clock divider circuit 772. The interface clock IF_CLK is provided to an input of the programmable clock divider circuit 772 and to the control circuit 778. The output of the programmable clock divider circuit 772 is coupled to the pre-scalar circuit 782. An output of the mode selection circuit 774 is coupled to the programmable clock divider circuit 772 and to the PLL divider calculation circuit 784. Base clock frequency register 600 is also coupled to the PLL divider calculation circuit 784. Outputs of the PLL divider calculation circuit 784 are coupled to the pre-scalar circuit 782 and to PLL 154.

Figure 11:
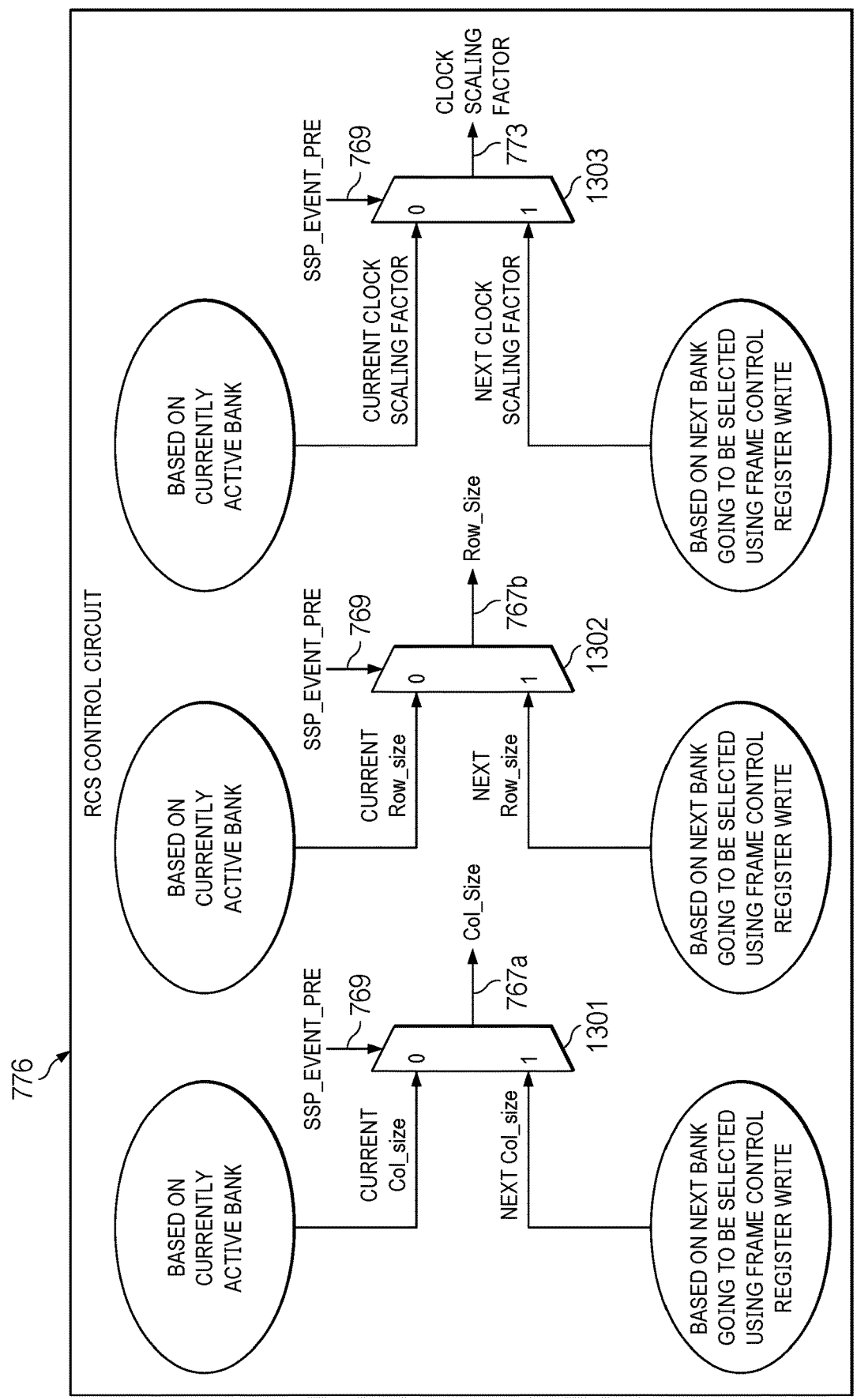
FIG. 11 is a schematic diagram of circuitry implementing a row/column/scaling factor (RCS) control circuit within the reference clock generator of FIG. 7, in an example.

The RCS control circuit 776 (an example of which is shown in FIG. 11) receives the decoded number of rows (row_size[8:0]) and columns (col_size[4:0]) from the frame control register 730 and the clock scaling factor from the clock scaling factor register 600. The control circuit 778 generates a control signal 769 SSP_EVENT_PRE which it provides to the RCS control circuit 776. Under control by the control signal SSP_EVENT_PRE 769, the RCS control circuit 776 provides the row and column numbers 767 and the clock scaling factor (CSF) 773 for the next interface frame to the mode selection circuit 774. The RCS control circuit 776 also provides the clock scaling factor 773 to the programmable clock divider circuit 772.

The mode selection circuit 774 couples to and receives input from the control circuit 778 and the RCS control circuit 776. As described below, the control circuit 778 receives the interface clock IF_CLK and the SSP bit (from the control register 732) and, from that generates other clock and control signals 789 that are provided to the mode selection circuit 774. Such signals include, for example, a REF_CLK_STARTED signal, a clock signal (CLK_2x) that has a frequency twice that of the interface clock IF_CLK, an inverse interface clock IF_CLKZ (logical inverse of IF_CLK), and a clock CLK_PHASE that has the same logical state as the interface clock IF_CLK. The use of signals 789 are described below regarding FIGS. 13 and 14.

The output of the mode selection circuit is a mode value (MODE) 775, which is provided to an input of the programmable clock divider circuit 772. The REF_CLK_STARTED signal from the common circuit 778 (one of control signals 789) is set to a logic high level when the PLL is to be enabled and causes the mode selection circuit 774 to lock the MODE 775, as described below. The programmable clock divider circuit 772 and the control circuit 778 receive the interface clock IF_CLK. The programmable clock divider circuit 772 divides down the frequency of the clock in accordance with the mode value 775 to produce the divided clock, CLK_DIV, to an input of the pre-scalar circuit 782. The pre-scalar circuit 782 may divide the frequency of CLK_DIV as desired based on the input frequency range supported by the PLL 154. The output PLL reference clock 783 from the pre-scalar circuit 782 is provided to the reference input 151 of the PLL 154. The divided clock CLK_DIV and thus the PLL reference clock 783 are generally a constant frequency even if the frequency of the interface clock IF_CLK changes. The PLL divider calculation circuit 784 receives the mode value 775 from the mode selection circuit 774 and a value indicative of the base clock frequency from the base clock frequency register 500, and generates a pre-scalar divide value 785 and a PLL divide value 787 to program the respective frequency divider within the pre-scalar circuit 782 and a feedback frequency divider within the PLL 154. The output of the PLL 154 is the PLL_CLK (which may be divided down further to be used as a clock for the audio interface). The PLL 154 includes an internal frequency divider to divide down the output clock (PLL_CLK) per the PLL divide value 787 so that PLL can adjust the output clock based on the comparison of this divided clock and input reference clock such that in the locked state, both divided clock (PLL_CLK divided by PLL divide value 787) and input reference clock will be phase and frequency matched If and when the manager 110 changes the frequency of the interface clock IF_CLK, the manager also updates the clock scaling factor register 500. The manager may update the shadow clock scaling factor register and then cause the shadow register to be the active register by writing to the shadow bank of the frame control register. The frame shape (number of rows and number of columns) may or may not be changed when the interface clock frequency changes. As described below, as the clock scaling factor 773 and/or row_size[4:0] and col_size[4:0] update, the mode selection circuit 774 determines whether the programmable clock divider circuit 772 should maintain the same divide ratio for the interface clock or change the divide ratio for the interface clock to maintain the same frequency for the divided clock CLK_DIV. If the divide ratio is to be changed, the mode selection circuit 774 provides a mode value 775 to the programmable clock divider circuit 772. The programmable clock divider circuit 772 also receives one or more clock signals 789 (described below) from the control circuit 778 and the clock scaling factor (CSF) value 773 from the RCS control circuit 776 to compute a new divide ratio for the interface clock. For example, if the frequency of the interface clock is reduced by a factor of 2, the divide ratio implemented by the programmable clock divider circuit 772 should be reduced by a factor of 2 to maintain a constant frequency for the divided clock.

In accordance with the SoundWire® protocol, the frequency of the interface clock IF_CLK and the frame "shape" (number of rows and columns of an interface frame) only change at the frame "boundary", which is the end of an interface frame. The divided clock CLK_DIV also should align with the frame boundary to maintain the same frequency of CLK_DIV even if the frequency of the interface clock IF_CLK changes. The mode selection circuit 774 implements multiple "modes," described below. The mode selection circuit 774 ensures that the falling edge of the divided clock CLK_DIV aligns with the frame boundary and the frequency of the divided clock CLK_DIV remains the same in a given mode. In general, the mode selection circuit 774 determines whether the product of the number of rows and the number of columns divided by the product of 2 and the divide ratio of the programmable clock divider 772 (based on the current mode value and clock scaling factor) is an integer, that is whether:

$$\frac{(\text{rows} * \text{columns})}{(2 * \text{divide ratio})} \tag{1}$$

where 'rows' refers to the decimal number of rows and 'columns' refers to the decimal number of columns. If the ratio of Eq. (1) is an integer, then a divide ratio for the current mode that maps to the next clock scaling factor can be used by the programmable clock divider circuit 772 and the resulting divided clock will align with the frame boundary.

Mode selection is performed before the start of a new interface frame based on Eq. (1) above as new row size, column size and clock scaling factor information becomes available before the start of the new interface frame. Before the REF_CLK_STARTED signal is set to logic high, the minimum mode value is chosen by the mode selection circuit 774 such that result of Eq. (1) is an integer. The lowest mode is checked first and if the output of Eq. (1) does not result in an integer, then the next consecutive mode value is checked until the result of Eq. (1) is an integer. When the result of Eq. (1) is an integer, then that mode is used further. When REF_CLK_STARTED signal is low, PLL 154 will be disabled so PLL_CLK is not going to be used for the audio interface 156 and thus manager 110 can change the frame shape and/or clock scaling factor resulting into a different mode value. Once REF_CLK_STARTED signal is set to high, then frame shape and/or clock scaling factor should be changed by the manager 110 such that no change will be required for the mode value maintaining the frequency of the divided clock CLK_DIV. If, however, a mode change is required when REF_CLK_STARTED is logic high, then the frequency of the divided clock CLK_DIV will change thereby temporarily forcing the PLL 154 to lose phase-lock.

FIG. 8 shows an example of the divide ratios for different modes for a particular base clock frequency and different clock factor factors. Column 801 has a base clock frequency of 19.2 MHz. For this base clock frequency, the manager 110 would have written a value of b001 to the base clock frequency register 500, as described above. The manager 110 may also write any of allowed clock scaling factors to the clock scaling factor register 600, including, as shown in column 802, clock scaling factors 1, 2, 4, 8 16, 32, and 64. Column 803 includes the frequency of the resulting interface clock IF_CLK based on the application of the various clock scaling factors. The interface clock frequency thus ranges from a maximum of 19.2 MHz (for a clock scaling factor of 1) down to a minimum of 0.3 MHz (for a clock scaling factor of 64).

The example of FIG. 8 also provides for seven different modes, designated MODE0, MODE1, MODE2, MODE3, MODE4, MODE5, and MODE6. For each mode, the table specifies the divide ratios for that mode that can be applied by the programmable clock divider circuit 772. The divide ratios for MODE0 are 64, 32, 16, 8, 4, 2, and 1, corresponding to the clock scaling factors of 1, 2, 4, 8, 16, 32, and 64. For a clock scaling factor of 1, the divide ratio for MODE0 is 64, which result in a divided clock CLK_DIV frequency of 0.3 MHz. For a clock scaling factor of 2 (doubled from the value of 1), the divide ratio for MODE0 is reduced from 64 by a factor 2 to a value of 32, which maintains the divided clock CLK_DIV frequency at a constant value of 0.3 MHz. Accordingly, the divided clock frequency for different clock scaling factors will remain at a constant 0.3 MHz as the divide ratios change accordingly. The divide ratios for MODE1 are 32, 16, 8, 4, 2, and 1, which correspond to clock scaling factors of 1, 2, 4, 8, 16, and 32. Divide ratios less than 1 are not permitted in this example. The resulting divide clock frequencies in this example are double that of MODE0, that is, 0.6 MHz. The divide ratios for MODE2 are 16, 8, 4, 2, and 1, which result in a divide clock frequency of 1.2 MHz. The divide ratios for MODE3 are 8, 4, 2, and 1, which result in a divide clock frequency of 2.4 MHz. The divide ratios for MODE4 are 4, 2, and 1, which result in a divide clock frequency of 4.8 MHz. The divide ratios for MODE5 are 2 and 1, which result in a divide clock frequency of 9.6 MHz. MODE6 in this example has only a single divide ratio of 1, which results in a divide clock frequency of 19.2 MHz.

If the frame shape and/or clock scaling factor change after REF_CLK_STARTED signal is set to high, the mode selection circuit 774 evaluates Eq. (1) above using the current mode's divide ratio corresponding to the next clock scaling factor (column 802) before the next interface frame starts. If the output of Eq. (1) results in an integer based on the current mode, then the same mode is continued to be used and the current mode's divide ratio corresponding to the next clock scaling factor (column 802) is used in programmable clock divider circuit 772 from the next interface frame onwards; otherwise a new mode is selected such that the output of Eq. (1) will become an integer and the new mode's divide ratio corresponding to the next clock scaling factor (column 802) is used in programmable clock divider circuit 772 from the next interface frame onwards.

Figure 7B:
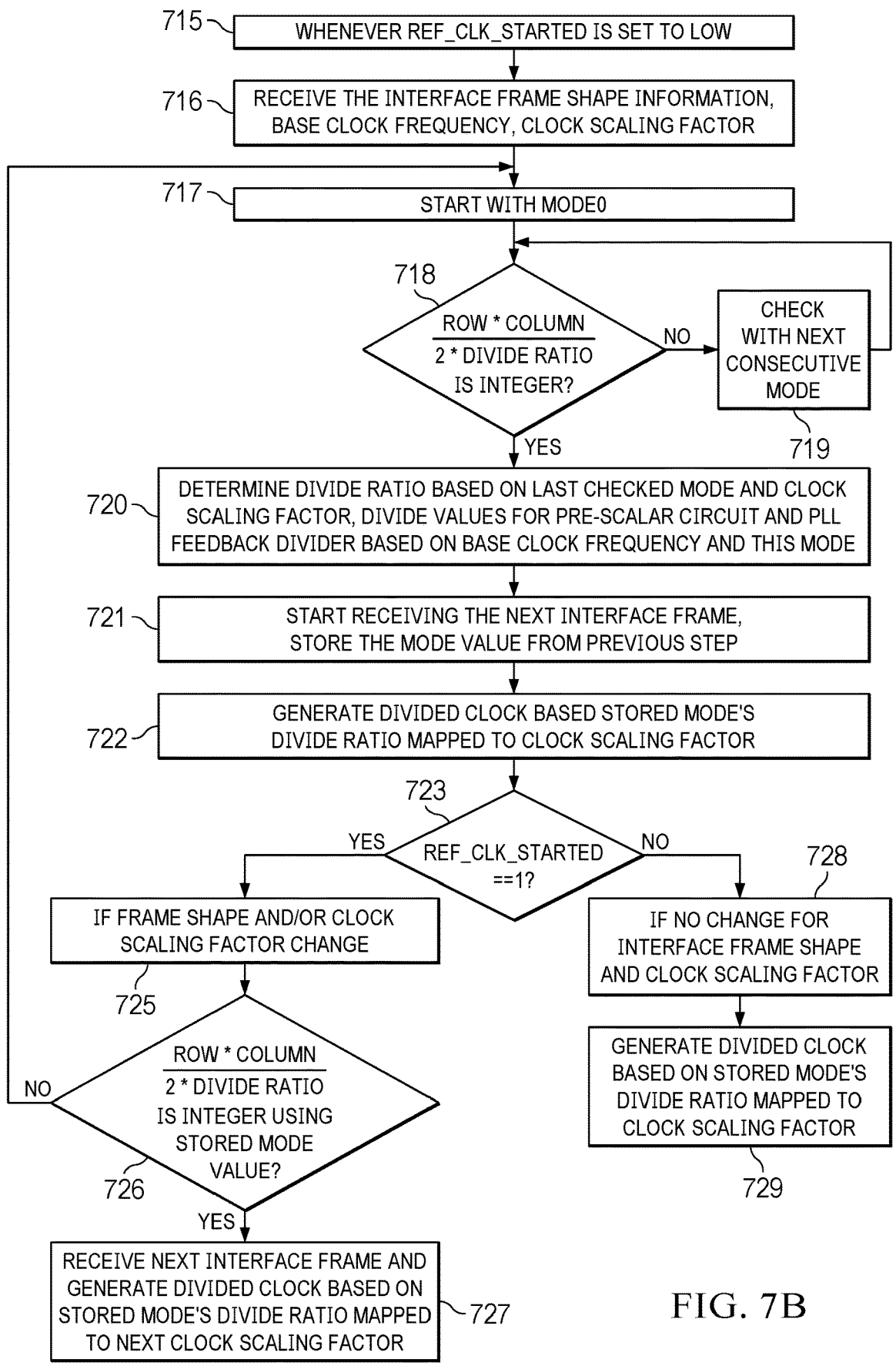
FIG. 7B is a flow diagram illustrating an example method of operation of the peripheral device of FIG. 7A.

FIG. 7B is a flow diagram of an example method of operation of the peripheral device 750 of FIG. 7A. The flow diagram of FIG. 7B includes blocks 715-729. At block 715, REF_CLK_STARTED is detected as being set to low. At block 716, the peripheral device 750 receives the information about interface frame shape, base clock frequency, and clock scaling factor. Starting with MODE0 (block 717), the control circuit 778 determines whether the ratio of Eq. (1) is an integer at block 718. If the ratio is not an integer (the "N" branch), then at block 719, the next consecutive mode is checked and control loops back to block 718.

If the ratio is an integer (the "Y" branch), then at block 720, the Mode selection circuit 774 determines the divide ratio based on the last checked mode and clock scaling factor, the divide values for the pre-scalar 782 and the PLL feedback divider in PLL 154 based on the base clock frequency and this mode. At block 721, upon the start of receiving the next interface frame, the mode value from block 720 is stored. Then, at block 722, the programmable clock divider circuit 772 generates the divided clock CLK_DIV based on the stored mode's divide ratio that is mapped to the clock scaling factor.

Upon REF_CLK_STARTED being set to high (block 723), which indicates that the PLL has been enabled, then blocks 725-727 are performed if there has been a frame shape and/or clock scaling factor change, or blocks 728 and 729 are performed if there is no change for the interface frame shape and clock scaling factor. At block 726 (for which a change on frame shape and/or clock scaling factor has occurred), Eq. (1) is evaluated using the stored mode's divide ratio. If the ratio is not an integer, then control loops back to block 717. Otherwise, at block 727, the next interface frame is received and the programmable clock divider circuit 772 generates the divided clock CLK_DIV based on the stored mode's divide ratio that is mapped to the next clock scaling factor. If, however, no change on frame shape and clock scaling factor has occurred (block 728), then at block 729, the programmable clock divider circuit 772 generates the divided clock CLK_DIV based on the stored mode's divide ratio that is mapped to the same clock scaling factor used for the previous interface frame.

Figure 9:
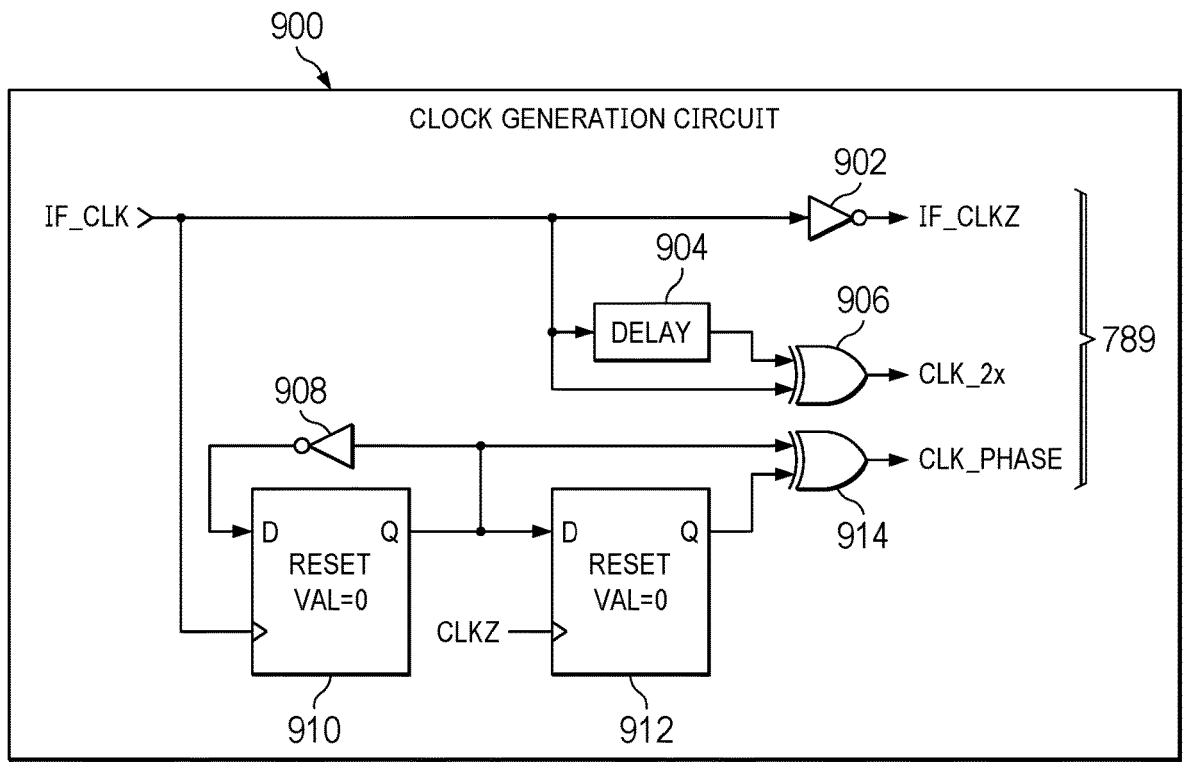
FIGS. 9 and 10 are schematic diagrams of circuitry implementing a control circuit within the reference clock generator of FIG. 7, in an example.
Figure 10:
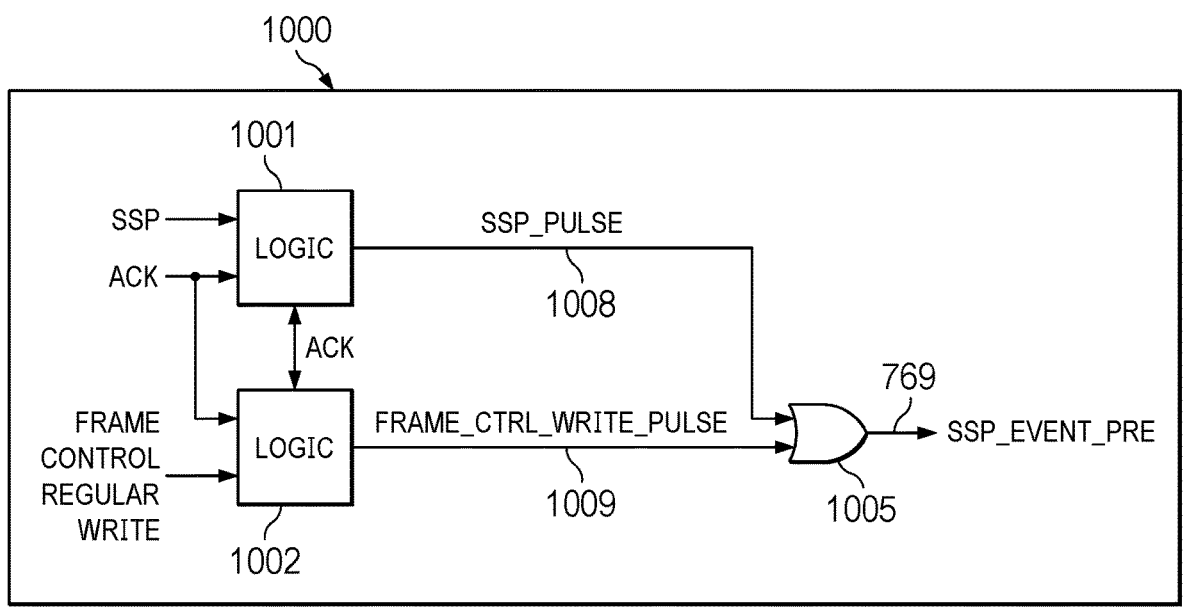

The control circuit 778 includes at least a clock generation circuit (FIG. 9) and a frame start circuit (FIG. 10). Referring to FIG. 9, the example clock generation circuit 900 includes inverters 902 and 908, a delay 904, exclusive OR gates 906 and 914, and data (D) flip-flops 910 and 912. The interface clock IF_CLK is provided to the inputs of inverter 902 and delay 904, one of the inputs of exclusive OR gate 906, and the clock input of D flip-flop 910. The output of delay 904 is coupled to another input of exclusive OR gate 906. The Q output of D flip-flop 910 is coupled to an input of exclusive OR gate 914, an input of inverter 908, and the D input of D flip-flop 912. The Q output of D flip-flop 912 is couple to another input of exclusive OR gate 914. The output of inverter 908 is coupled to the D input of D flip-flop 910.

Inverter 902 inverts the interface clock IF_CLK to generate clock IF_CLKZ at its output. The combination of delay 904 and exclusive OR gate 906 generates a clock CLK_2× at the output of exclusive OR gate 906 that has a frequency that is twice that of IF_CLK.

Flip-flop 910 is clocked by the interface clock (IF_CLK), and flip-flop 912 is clocked by the inverse of the interface clock (IF_CLKZ). The signal at the Q output of D flip-flop 910 is inverted by inverter 908, and the inverse of the signal at the Q output of D flip-flop 910 is provided to the data (D) input of flip-flop 910. The outputs of the flip-flops 910 and 912 are exclusively-OR'd together by exclusive OR gate 914 to produce the signal CLK_PHASE, which is logic high when IF_CLK is logic high and logic low when IF_CLK is logic low. Clocks IF_CLKZ, CLK_2×, and CLK_PHASE (part of signals 789 in FIG. 7) are used by the mode selection circuit shown in FIGS. 13 and 14 and described below.

FIG. 10 is a schematic of an example implementation of frame start circuit 1000, which is part of the control circuit 778. The frame start circuit 100 includes logic 1001, 1002, and OR gate 1005. The outputs of logic 1001 and 1002 are coupled to inputs of OR gate 1005. Logic 1001 receives at its inputs the SSP and ACK bits from the control word. If the SSP bit is asserted (e.g., logic 1) and the control word is successfully acknowledged, logic 1001 produces a pulse (SSP_PULSE 1008) for one-half cycle of the interface clock (IF_CLK) during the last bit slot of the interface frame 400. If the frame control register 730 is written and the control word is successfully acknowledged, logic 1002 produces a pulse (FRAME_CTRL_WRITE_PULSE 1009) for one-half cycle of the interface clock (IF_CLK) during the last bit slot of the interface frame. OR gate 1005 receives the SSP_PULSE 1008 and the FRAME_CTRL_WRITE_PULSE 1009 and logically OR's them together to produce the output signal SSP_EVENT_PRE 769, which indicates that a new frame is about to begin (in the next half cycle of the interface clock IF_CLK) and either an SSP bit has been asserted or the frame control register has been written.

FIG. 11 is a schematic showing an example implementation of the RCS control circuit 776. The function performed by the RCS control circuit is to provide the row_size 767a, the col_size 767b (collectively, row_size 767a and col_size 767b are represented in FIG. 7A with the single reference number 767), and the clock scaling factor 773 to the mode selection circuit 774, as well as the clock scaling factor 773 to the programmable clock divider circuit 772 based on the current or next banks. The RCS control circuit 776 includes multiplexers 1301, 1302, and 1303. Each multiplexer has a 0-input and a 1-input as well as a selection input. The signal SSP_EVENT_PRE from the frame start control circuit 1000 is the selection signal coupled to the selection inputs of the multiplexers. The logic state of SSP_EVENT_PRE 769 specifies whether the register values from the next bank should be used or from the current bank (i.e., the currently active bank). If the manager 110 writes to the shadow bank of the frame control register, then the shadow bank will become the next bank to be used for all registers, otherwise next bank will be same as currently active bank The 0-inputs of the multiplexers receive the column size, row size, and clock scaling factor for the current bank. The 1-inputs of the multiplexers receive the column size, and row size, and clock scaling factor from the next bank decided based on the recent write to the frame control register 730. Upon SSP_EVENT_PRE 769 pulsing logic high as described above (which is in response to FRAME_CTRL_WRITE_PULSE 1009 pulsing high or in response to SSP_PULSE 1008 pulsing high), the values of the column size, row size, and clock scaling factor in the next bank are output by the respective multiplexers.

Figure 12:
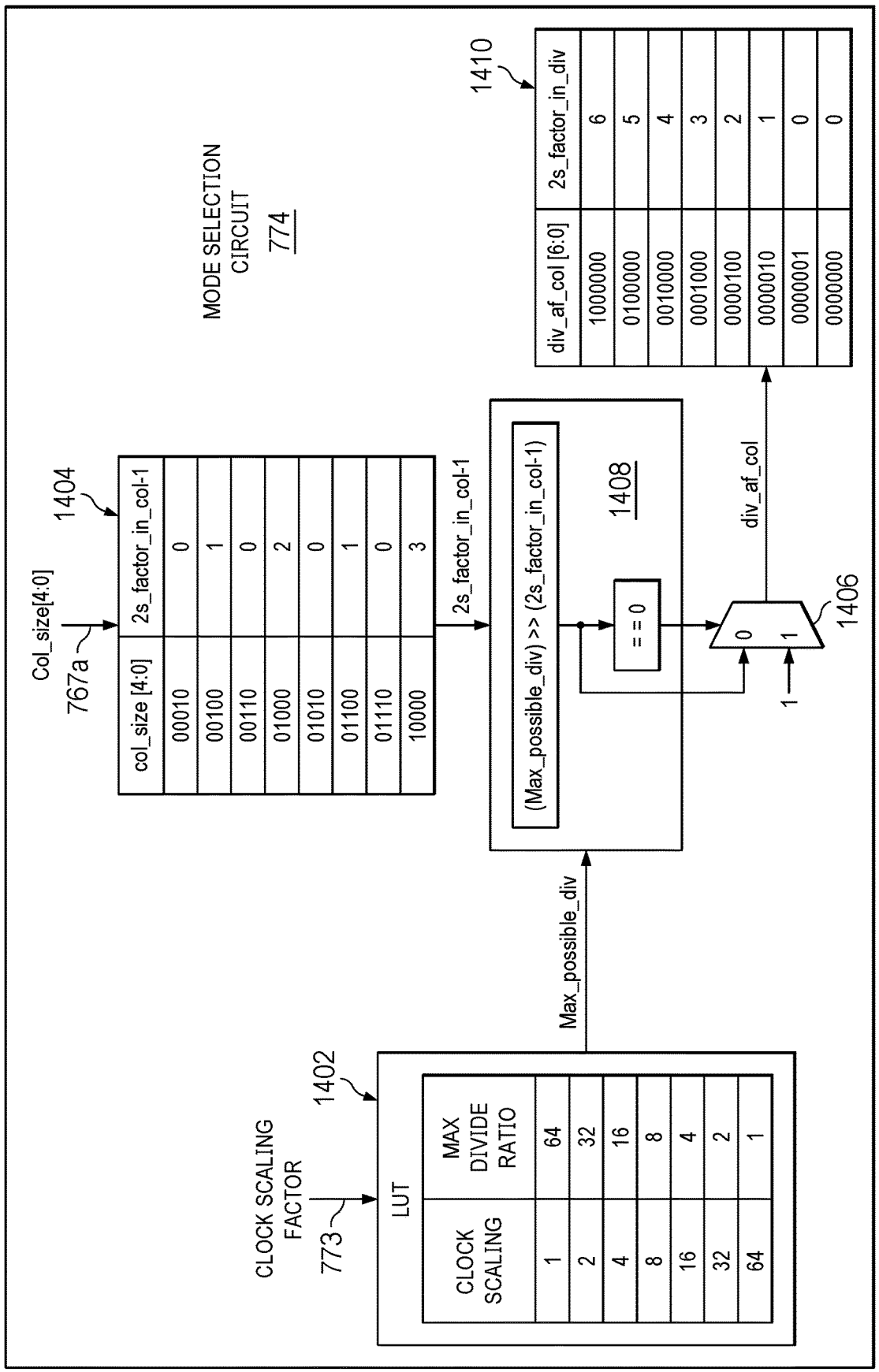
FIGS. 12 and 13 are schematic diagrams of circuitry implementing a mode selection circuit within the reference clock generator of FIG. 7, in an example.
Figure 13:
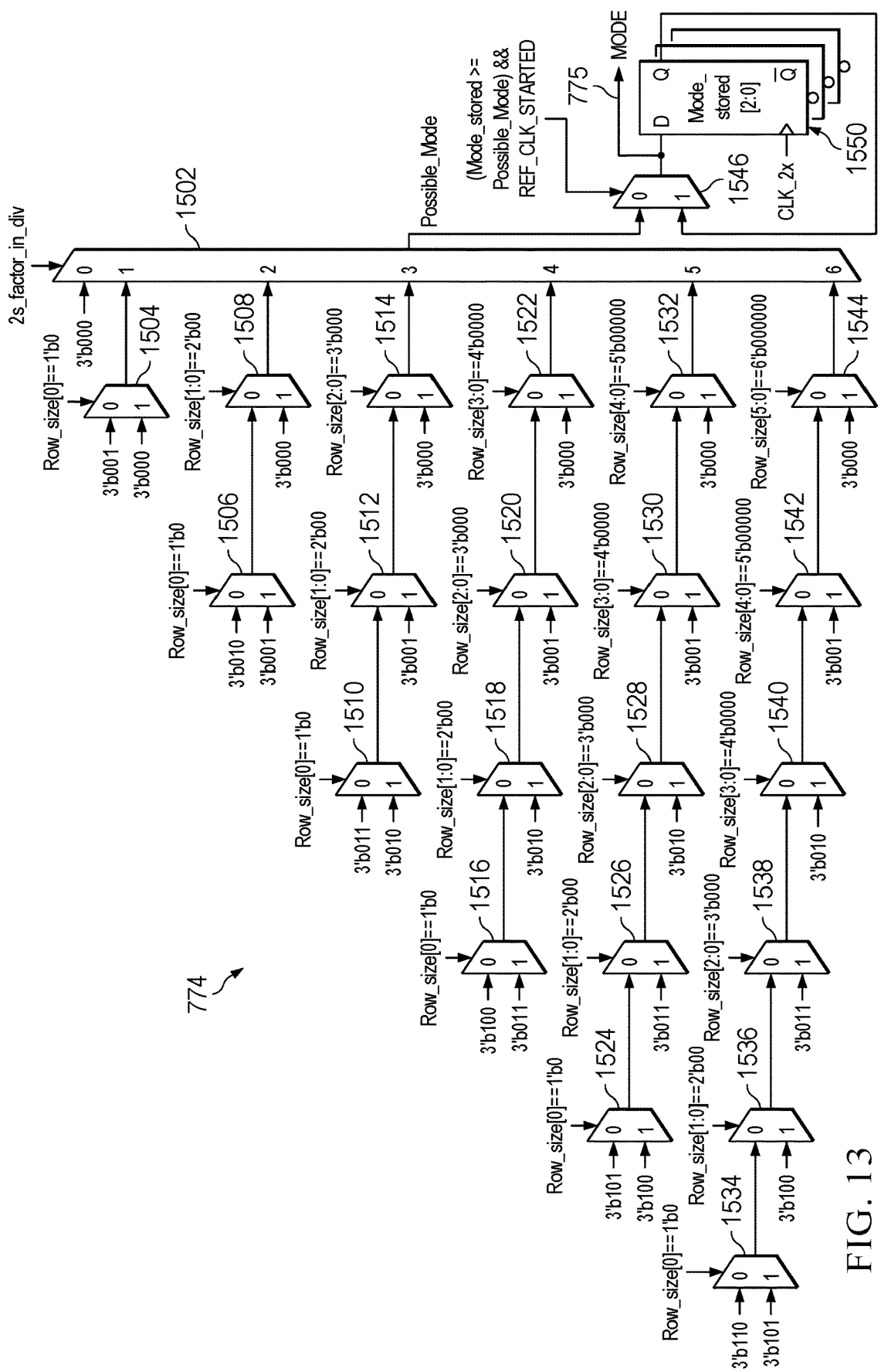

FIGS. 12 and 13 collectively are schematics illustrating an example implementation of the mode selection circuit 774 (i.e., the mode selection circuit 774 is illustrated across FIGS. 12 and 13). The diagrams shown in FIGS. 12 and 13 are an implementation of the algorithm described above for the mode selection circuit 774, which is that the mode selection circuit 774 determines whether the ratio of the product of the next number of rows and the next number of columns to the product of 2 and the divide ratio corresponding to the next clock scaling factor is an integer.

The schematic of FIG. 12 includes look-up tables (LUTs) 1402, 1404, and 1410, a multiplexer 1406, and logic 1408. The example LUT 1402 illustrated in FIG. 12 is for the mapping between the clock scaling factor and the maximum possible divide ratio value (which is the same as MODE0). As shown in LUT 1402, the clock scaling factors range from 1 to 64, the corresponding maximum divide ratio values range from 64 down to 1. These values are also shown in FIG. 8. The clock scaling factor 773 from the RCS control circuit 776 is used as an index value into LUT 1402 to produce the output value, Max_possible_div, which is the maximum divide ratio value in the LUT corresponding to the clock scaling factor.

LUT 1404 maps column size values to a value that is the two's factor in each column size value minus 1. The two's factor is the maximum power of 2 by which the column size value is divisible. The two's factor in the column size is the same as the number of consecutive 0's in a column size value starting with the least significant bit (LSB). In this example, each column size value is a 5-bit value. A column size value of b00010 has a two's factor of 1, and a column size value of b00100 has a two's factor of 2. The righthand column in the LUT 1404 is the corresponding two's factor minus 1. The output value from LUT 1404 is the value of (2s_factor_in_col−1) and is provided to logic 1408 along with Max_possible_div from LUT 1402.

Logic 1408 includes a bit-shifter that shifts the bits of Max_possible_div by the value of 2s_factor_in_col−1 to implement a divide function of Max_possible_div by the value of 2s_factor_in_col−1. Multiplexer 1406 has 0-input and 1-input. The 1-input has a fixed value of logic '1.' The 0-input is the right-shifted value of Max_possible_div. The selection signal to multiplexer 1406 is logic 1 if the right shifted value of Max_possible_div is 0 to select the 1-input; otherwise the selection signal to the multiplexer 1406 is logic 0 to select the 0-input. The output signal from the multiplexer 1406 is div_af_col and is an index value input LUT 1410. LUT 1410 maps the values of div_af_col to a value called 2s_factor_in_div. The output value of LUT 1410 (2s_factor_in_div) is used in the diagram of FIG. 13.

The example of FIG. 13 includes a seven-input multiplex 1502 (the number of inputs is application-specific and depends on the number of modes that are supported), multiplexers 1504-1546, and flip-flops 1550. 0-input of multiplexer 1502 is MODE0 i.e. 3'b000. The output of multiplexer 1504 couples to the 1-input of multiplexer 1502. The output of multiplexer 1508 couples to the 2-input of multiplexer 1502. The outputs of multiplexers 1514, 1522, 1532, and 1544 couple to the respective 3-input, 4-input, 5-input, and 6-input of multiplexer 1502. Each of multiplexers 1504-1544 has a 0-input and a 1-input, and each such multiplexer input is coupled to a possible mode value. In this example, the mode values are 3-bit binary numbers. The selection signals for each multiplexer 1504-1544 are produced based on certain bits of the row size values. For example, the selection signal for multiplexer 1504 is the LSB of the row size value. The selection signal for multiplexer 1508 is a logic 1 (to select that multiplexer's 1-input) if the two LSBs of the row size are both logic 0.

The selection signal for multiplexer 1502 is the 2s_factor_in_div value from LUT 1410 in FIG. 12. The output value from multiplexer 1502 is Possible_Mode, which is provided to the 0-input of multiplexer 1546. The output of multiplexer 1546 is coupled to the D input of flip-flops 1550. For a 3-bit mode value, there are three flip-flops 1550—one for each mode value bit. The Q outputs of flip-flops 1550 are coupled to the 1-input of multiplexer 1546. The flip-flops 1550 are clocked using the clock CLK_2× (from the clock generation circuit 900, FIG. 9). The selection signal for multiplexer 1546 is generated by logic (not specifically shown) that forces the selection to be logic 1 when the previous mode value stored in flip-flops 1550 is greater than or equal to the Possible_Mode value from multiplexer 1502 and REF_CLK_STARTED is asserted (which is the case when the divided clock CLK_DIV should be provided to the PLL 154). In this state, the previously stored mode value is provided back through the 1-input of multiplexer 1546 and re-stored in flip-flops 1550 (no update of the mode value). If, however, the selection signal for multiplexer 1546 is logic 0 (which occurs when the previous mode values stored in flip-flops 1550 is less than the Possible_Mode value from multiplexer 1502 or the REF_CLK_STARTED signal is logic low, the newly determined mode value (Possible_Mode) is provided by multiplexer 1546 to the flip-flops 1550 for storage therein. The output MODE signal 775 is the output value from multiplexer 1546.

Figure 14:
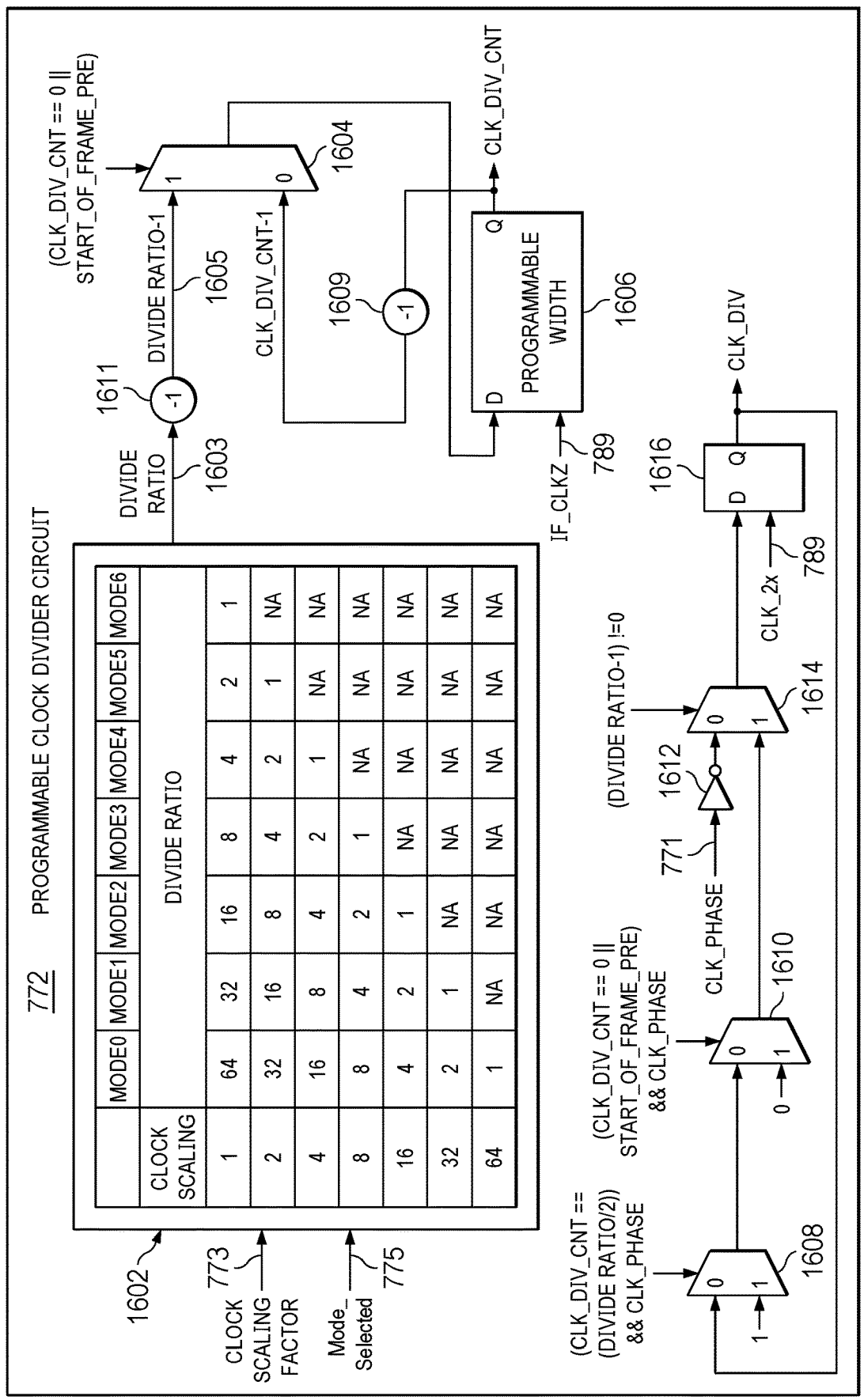
FIG. 14 is a schematic diagram of circuitry implementing a clock divider circuit within the reference clock generator of FIG. 7, in an example.

FIG. 14 is a schematic of an example implementation of the programmable clock divider circuit 772. In this example, the programmable clock divider circuit 772 includes a LUT 1602, multiplexers 1604, 1608, 1610, and 1614, flip-flops 1606 and 1616, and an inverter 1614. The clock scaling factor 773 from the RCS control circuit 776 and the MODE signal 775 are used as indices to LUT 1602. The LUT 1602 maps the clock scaling factor 773 and the MODE signal 775 to a divide ratio 1603. The divide ratio value 1603 is provided to a subtractor 1611 which outputs a value 1605 that is the divide ratio value minus one. The 1-input of multiplexer 1604 is coupled to the output of the subtractor 1611, and the 0-input of multiplexer 1604 is coupled to the output of the subtractor 1609. The CLK_DIV_CNT signal is the output signal from the Q output of flip-flop 1606. The selection signal for multiplexer 1604 is logic high when CLK_DIV_CNT is equal to 0 or a signal START_OF_FRAME_PRE is asserted logic high, and logic low otherwise. The signal START_OF_FRAME_PRE is pulsed logic high for a half cycle of the interface clock IF_CLK during the last bit slot of the interface frame.

The output from multiplexer 1604 is coupled to the D input of flip-flop 1606 (which may be implemented as multiple flip-flops in series for a programmable width of the counter based on the maximum divide ratio). The clock input of flip-flop 1606 receives the clock IF_CLKZ. The combination of the multiplexer 1604 band D flip-flop 1606 functions as a counter used to generate CLK_DIV by dividing the frequency of the interface clock IF_CLK_. The Q output of multiplexer 1606 provides the signal CLK_DIV_CNT, which is coupled to a subtractor 1609. Subtractor 1609 provides the signal CLK_DIV_CNT minus one value to the 0-input of multiplexer 1604. The CLK_DIV_CNT signal is also used in logic to generate the selection signals for multiplexers 1608 and 1610. The selection signal for multiplexer 1608 becomes logic 1 when counter value CLK_DIV_CNT is equal to half of the divide ratio 1603 decided by LUT 1602 and the logic level of the interface clock IF_CLK is also logic high. The selection signal for multiplexer 1610 becomes logic 1 when the logic level of the interface clock IF_CLK is also logic high and either the counter value CLK_DIV_CNT is equal to 0 or the START_OF_FRAME_PRE signal is asserted logic high.

The Q output of flip-flop 1616 is coupled to the 0-input of multiplexer 1608. The 1-input of multiplexer 1608 is logic 1. The output of multiplexer 1608 is coupled to the 0-input of multiplexer 1610. The 1-input of multiplexer 1610 is logic 1. The output of multiplexer 1610 is coupled to the 1-input of multiplexer 1614. The input of inverter 1612 receives the signal CLK_PHASE generated by the control circuit 778 as described above. The inverter 1612 inverts CLK_PHASE and provides the inverted signal to the 0-input of multiplexer 1614. The output of multiplexer 1614 is coupled to the D input of flip-flop 1616. The clock input of flip-flop 1616 is CLK_2× signal, described above. The output of multiplexer 1616 is the divided clock CLK_DIV, which is clock provided to the pre-scalar 782 for the PLL 154.

The divide ratio value is selected from LUT 1602 based on the clock scaling factor and the current mode. If the divide ratio value is 1, then divided clock CLK_DIV is the same (same frequency) as the interface clock IF_CLK, otherwise the counter CLK_DIV_CNT value is used to generate the divided clock CLK_DIV. If divide ratio value is greater than 1, then the counter CLK_DIV_CNT is loaded with the value of the divide ratio value minus 1 at the start of the interface frame 400 and CLK_DIV is also set to 0. The counter's output signal CLK_DIV_CNT decreases by 1 at every edge of IF_CLKZ. When CLK_DIV_CNT becomes equal to one-half of divide ratio value and the level of IF_CLK is high, then CLK_DIV is set to high. When CLK_DIV_CNT becomes 0 and the level of IF_CLK is logic high, then CLK_DIV is again set to logic 0 and the counter CLK_DIV_CNT is also loaded with divide ratio value minus 1.

Figure 15:
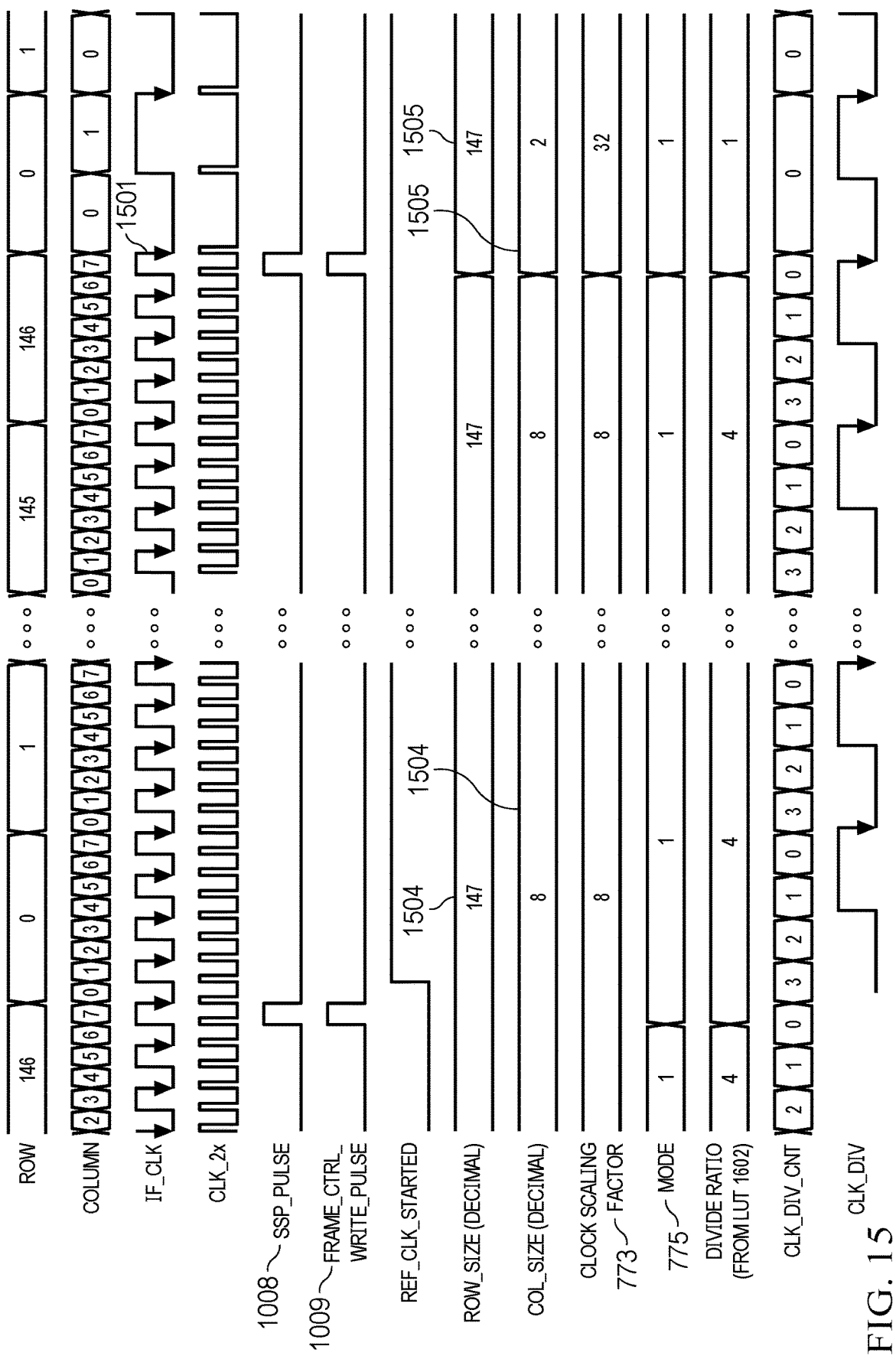
FIG. 15 is a timing diagram illustrating the operation of the reference clock generator of FIG. 7, in an example.

FIG. 15 is an example timing diagram illustrating that the divided clock CLK_DIV remains at the same frequency despite a four-fold decrease in the frequency for the interface clock IF_CLK. The interface clock IF_CLK is illustrated with a frequency change occurring at 1501. The clock CLK_2× is shown below IF_CLK and has a frequency twice that of IF_CLK, and thus also experiences a frequency change corresponding to the frequency change for IF_CLK. The SSP_PULSE 1008 and the FRAME_CTRL_WRITW_PULSE 1009 are shown just below CLK_2×. The row and column numbers in this example are initially 147 and 8, respectively, as shown at 1504, and change to 147 and 2, respectively, as shown at 1505 along with the decrease in the frequency IF_CLK at 1501. Commensurate with the frequency change of IF_CLK is a change in the clock scaling factor (increases by a factor of four) provided by the manager 110 to the peripheral device 250. Divide ratio of 4 is used until the frequency change occurs, and then divide ratio of 1 is used to account for the four-fold decrease in frequency. The programmable clock divider circuit 772 uses the new divide ratio to maintain the frequency of CLK_DIV at the same frequency.

In the above example, the base clock frequency is 19.2 MHz. Initially, the interface clock IF_CLK is 2.4 MHz and REF_CLK_STARTED signal is low so the mode selection circuit starts checking the output of Eq. (1) using MODE0. MODE0's divide ratio mapped to clock scaling factor of 8, as shown in FIG. 8. The number of rows are 147 and the number of columns are 8 for the interface frame. The output of Eq. (1) i.e. (147*8/2*8)=73.5 which is not an integer with MODE0 so then the mode selection circuit checks the next consecutive mode which is MODE1. MODE1's divide ratio mapped to clock scaling factor of 8 is 4 as shown in FIG. 8. The output of Eq. (1) i.e. (147*8/2*4)=147, which is an integer with MODE1 so MODE1 is selected to be used for next interface frames until any change happens for the interface frame shape (based on row and column numbers 767) or clock scaling factor 773. The frequency of the divided clock CLK_DIV generated from programmable clock divider 772 is 2.4 MHz/4=0.6 MHz. The divide values for the pre-scalar circuit and the PLL feedback dividers are decided based on the base clock frequency of 19.2 MHz and MODE1.

REF_CLK_STARTED signal goes high in the next interface frame in this example. The manager 110 updates the frame shape and clock scaling factor (e.g., by updating the clock scaling factor in a shadow bank register and switching the shadow bank to the active bank upon writing to the shadow bank of frame control register), and provides a clock scaling factor of 32 along with information of next interface frame shape. The number of columns in the next interface frame will be 2 based on the write to the frame control register. Before the start of new interface frame with IF_CLK as 0.6 MHz, the output of Eq. (1) is checked again based on MODE1. MODE1's divide ratio mapped to clock scaling factor of 32 is 1 as shown in FIG. 8 so output of Eq. (1) i.e. (147*2/2*1)=147 is an integer. Since the output of Eq. (1) is still an integer with the current mode i.e. MODE1, there will be no change for the divide values for the pre-scalar circuit and PLL feedback dividers. Also, the interface clock IF_CLK is divided by a divide ratio of 1 to generate the same divided clock CLK_DIV even after frequency change for IF_CLK.

In another example, the base clock frequency is 19.2 MHz. Initially, the interface clock IF_CLK is 1.2 MHz and REF_CLK_STARTED signal is low so mode selection circuit starts checking the output of Eq. (1) using MODE0. MODE0's divide ratio mapped to clock scaling factor of 16 is 4 as shown in FIG. 8. The number of rows are 128 and the number of columns are 8 for the interface frame. The output of Eq. (1) i.e. (128*8/2*4)=128, which is an integer with MODE0 so MODE0 is selected to be used for the next interface frames until any change happens for the interface frame shape (based on row and column numbers 767) or clock scaling factor 773. The frequency of the divided clock CLK_DIV generated from programmable clock divider is 1.2 MHz/4=0.3 MHz. Divide values for pre-scalar circuit and PLL feedback dividers are decided based on base clock frequency of 19.2 MHz and MODE0.

When REF_CLK_STARTED signal goes high, then the manager 110 updates the frame shape and clock scaling factor, and provides a clock scaling factor of 64 along with information of the next interface frame shape. The number of columns in the next interface frame will be 2 and the number of rows in the next interface frame will be 256 based on write to frame control register. Before the start of new interface frame with IF_CLK as 0.3 MHz, output of Eq. (1) is checked again based on MODE0. MODE0's divide ratio mapped to clock scaling factor of 64 is 1 as shown in FIG. 8 so output of Eq. (1) i.e. (256*2/2*1)=256 is an integer. Since the output of Eq. (1) is still and integer with the current mode, there will be no change for the divide values for pre-scalar circuit and PLL feedback dividers. Also, the interface clock IF_CLK will be divided by divide ratio of 1 to generate the CLK_DIV of the same frequency i.e. 0.3 MHz/1=0.3 MHz.

The reference clock generator 770 described above for the embodiment of FIG. 7 assumes that the base clock frequency value is available to the PLL divider calculation circuit 784 to determine the appropriate frequency divide values for the pre-scalar 782 and the feedback divider within the PLL 154. As noted above and illustrated the example base clock frequency register 500 in FIG. 5, it is possible that the manager 110 programs a value of b000 into the base clock frequency register 500. A value of b000 is a value that does not correspond to any particular base clock frequency value. In that case, the PLL divider calculation circuit 784 would not be able to determine the appropriate frequency divide values for the pre-scalar 782 and the PLL 154.

Figure 16A:
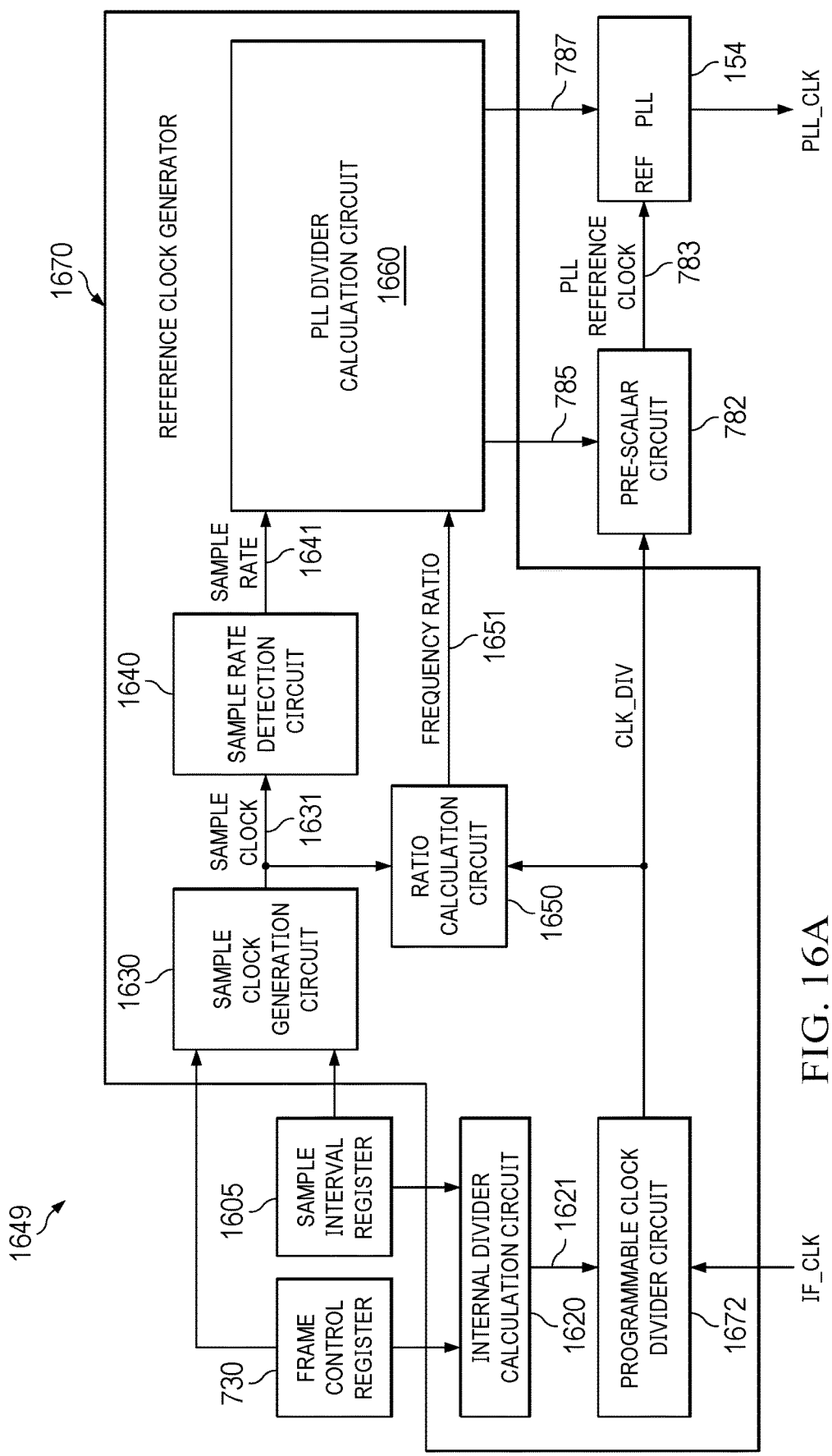
FIG. 16A is a schematic diagram of a peripheral device including a reference clock generator, in another example.

FIG. 16A is a block diagram of at least a portion of a peripheral device 1649 in accordance with an embodiment which can program the divide values for the pre-scalar circuit 782 and the feedback divider within the PLL 154 without the base clock frequency value. The peripheral device 1649 is an example of peripheral device 250. The peripheral device 1649 includes the frame control register 730 and the sample interval register 1605 (both part of registers 158), the pre-scalar circuit 782, the PLL 154, and a reference clock generator 1670. Reference clock generator 1670 is an example implementation of the reference clock generator 270 in FIG. 2A, and includes an internal divider calculation circuit 1620, a sample clock generation circuit 1630, a sample rate detection circuit 1640, a ratio calculation circuit 1650, a PLL divider calculation circuit 1660, and a programmable clock divider circuit 1672.

The frame control register 730 is coupled to the internal divider calculation circuit 1620 and to the sample clock generation circuit 1630. The sample interval register 1605 is also coupled to the sample clock generation circuit 1630. The output of the internal divider calculation circuit 1620 is coupled to an input of the programmable clock divider circuit 1672. The interface clock IF_CLK also is provided to an input of the programmable clock divider circuit 1672. The output of the programmable clock divider circuit 1672 provides the divided clock CLK_DIV, described above. The output of the programmable clock divider circuit 1672 is coupled to both the pre-scalar circuit 782 and to the ratio calculation circuit 1650. The output of the sample clock generation circuit 1630 is coupled to inputs of the sample rate detection circuit 1640 and the ratio calculation circuit 1650. An output signal 1641 (sample rate) of the sample rate detection circuit 1640 and an output signal 1651 (frequency ratio) of the ratio calculation circuit 1650 are provided to the PLL divider calculation circuit 1660. Outputs of the PLL divider calculation circuit 1660 are coupled to the pre-scalar circuit 782 and to the PLL 154, as shown. The PLL divider calculation circuit 1660 uses the signals 1641 and 1651 from the sample rate detection circuit 1640 and the ratio calculation circuit 1650 to generate the pre-scalar divide value 785 and the PLL feedback divide value 787 for the pre-scalar circuit 782 and the PLL 154, respectively.

In accordance with the Soundwire® protocol, the number of columns of an interface frame 400 changes proportionally to the frequency of the interface clock IF_CLK. For example, if manager 110 changes the frame shape to have half the number of columns, then manager 110 also reduces the frequency of the interface clock IF_CLK in half (e.g., doubles the clock scaling factor). The programmable clock divider 1672 is a frequency divider which divides the frequency of the interface clock IF_CLK by a divide ratio 1621 provided by the internal divider calculation circuit 1620. In the embodiment of FIG. 16A, assuming that the sample interval is an integer multiple of the number of columns, the internal divider calculation circuit 1620 determines the divide ratio 1621 for the programmable clock divider circuit 1672 by dividing the number of columns of the interface frame 400 by two (column number/2). The sample clock generation circuit 1630, sample rate detection circuit 1640, ratio calculation circuit 1650, and the PLL divider calculation circuit 1660 function to determine the divide values for the pre-scalar circuit 782 and the feedback divider within the PLL 154. The sample clock generation circuit 1630 generates a sample clock 1631 whose frequency is equal to the audio frame rate. Each audio frame includes multiple bits, and each bit is provided across the interface between the manager 110 and the peripheral device 1649 in accordance with the interface clock IF_CLK (e.g., each rising and falling edge of IF_CLK clocking a bit of the audio frame). The audio frame rate is the number of audio frames (samples) that can be transmitted across the interface per second given the frequency of the interface clock IF_CLK. In the example of a double data rate interface clock IF_CLK, the audio frame rate is:

$$\text{Audio frame rate} = \frac{\text{Freq of IF\_CLK} * 2}{\text{sample interval}} \quad (2)$$

where, as mentioned above, the sample interval is the number of bits of each audio frame. The manager 110 sets the IF_CLK frequency relative to the sample interval. For example, if the frequency of the interface clock IF_CLK is to be reduced by a factor of four, the manager 110 also reduces the sample interval by a factor of four. Accordingly, the audio frame rate does not change despite changes to the frequency of the interface clock IF_CLK.

The sample clock generation circuit 1630 uses the number of rows and number of columns from the frame control registers 730 and the sample interval from the sample interval register 1605 to generate a pulse at the beginning (or end) of each sample interval. These series of pulses is the sample clock 1631. The frequency of the sample clock 1631 is thus the same as the audio frame rate.

The sample rate detection circuit 1640 determines a value indicative of the frequency of the sample clock 1631. In one example, the sample rate detection circuit 1640 includes a counter and a reference clock that has a frequency substantially higher (e.g., 10 times higher) than the frequency of the sample clock 1631. The counter counts the number of pulses of the high frequency between successive pulses of the sample clock 1631. The count value from the counter provides an indication of the frequency of the sample clock 1631. In one example, the count value from the counter is output as the sample rate 1641, which is provided to the PLL divider calculation circuit 1660.

The ratio calculation circuit 1650 determines the ratio of the frequency of the divided clock CLK_DIV and the frequency of the sample clock 1631. In one example, the ratio calculation circuit 1650 also includes a counter which counts the number of pulses of CLK_DIV between successive pulses of the sample clock 1631. In one example, that counter's count output is the frequency ratio value 1651 provided to the PLL divider calculation circuit 1660.

The values for the pre-scalar circuit 782 and feedback divider of the PLL 154 are calculated from an LUT using the sample rate 1641 and frequency ratio value 1651 based on the required output clock frequency.

In a specific example, a first frame shape of the interface frame 400 may be 48 rows×8 columns and other configuration may be as described below. base clock frequency equal to 19.2 MHz, Clock scaling factor equal to 4 i.e. IF_CLK equal to 4.608 Mhz, the sample interval equal to 192 bits. The programmable clock divider circuit 1672 thus divides the frequency of the interface clock (4.608 MHz) by a divide ratio of 4 (number of columns/2) to produce the divided clock CLK_DIV with a frequency of 4.608 MHz divided by 4 which is 1.152 MHz. The sample rate (the number of audio frames per second for the given interface clock frequency) is (4.608 MHz*2/192), which is 48 KHz. The frequency ratio of the divided clock (i.e. CLK_DIV) frequency to the sample rate frequency is 1.152 MHz/48 KHz, which equals 24.

If the first frame shape were to change to a second frame shape of 48 rows×2 columns proportional to IF_CLK changing from 4.608 MHz to 1.152 Mhz, the sample interval would also be changed by manager from 192 bits to 48 bits. The number of columns divided by 2 i.e. 2/2 which equals 1. The programmable clock divider circuit 1672 divides the frequency of the interface clock (1.152 MHz) by a divide ratio of 1 to produce the divided clock CLK_DIV with a frequency of 1.152 MHz divided by 1 i.e. 1.152 MHz. Thus, the frequency of the divided clock CLK_DIV remains the same despite changes in the interface clock frequency. The sample rate remains the same i.e. 1.152 MHz*2/48, which is 48 KHz. The frequency ratio of the divided clock CLK_DIV frequency to the sample rate frequency is 1.152 MHz/48 KHz, which equals 24—the same as for the first frame shape example above. As the inputs for PLL are all same so there will be no impact on PLL output PLL_CLK.

The divide ratio is a function of the number of columns of the interface frame 400, not the number of rows. Accordingly, in an example in which a first frame shape of 48 rows×8 columns changes to a second frame shape of 256 rows×2 columns, the frequency of the interface clock IF_CLK changes, for example, from 4.608 MHz to 1.152 MHz. For the first frame shape, the number of columns divided by 2 is 8/2 which equals 4. The programmable clock divider circuit 1672 thus divides the frequency of the interface clock (4.608 MHz) by a divide ratio of 4 to produce the divided clock CLK_DIV with a frequency of 4.608 MHz divided by 4 which is 1.152 MHz. For the second frame shape, the number of columns also is divided by 2, which is 2/2 which equals 1. The programmable clock divider circuit 1672 divides the frequency of the interface clock (1.152 MHz) by a divide ratio of 1 to produce the divided clock CLK_DIV with a frequency of 1.152 MHz divided by 1, or 1.152 MHz. Thus, the frequency of the divided clock CLK_DIV remains the same. The sample interval and sample rate values track the same as in the previous example.

Figure 16B:
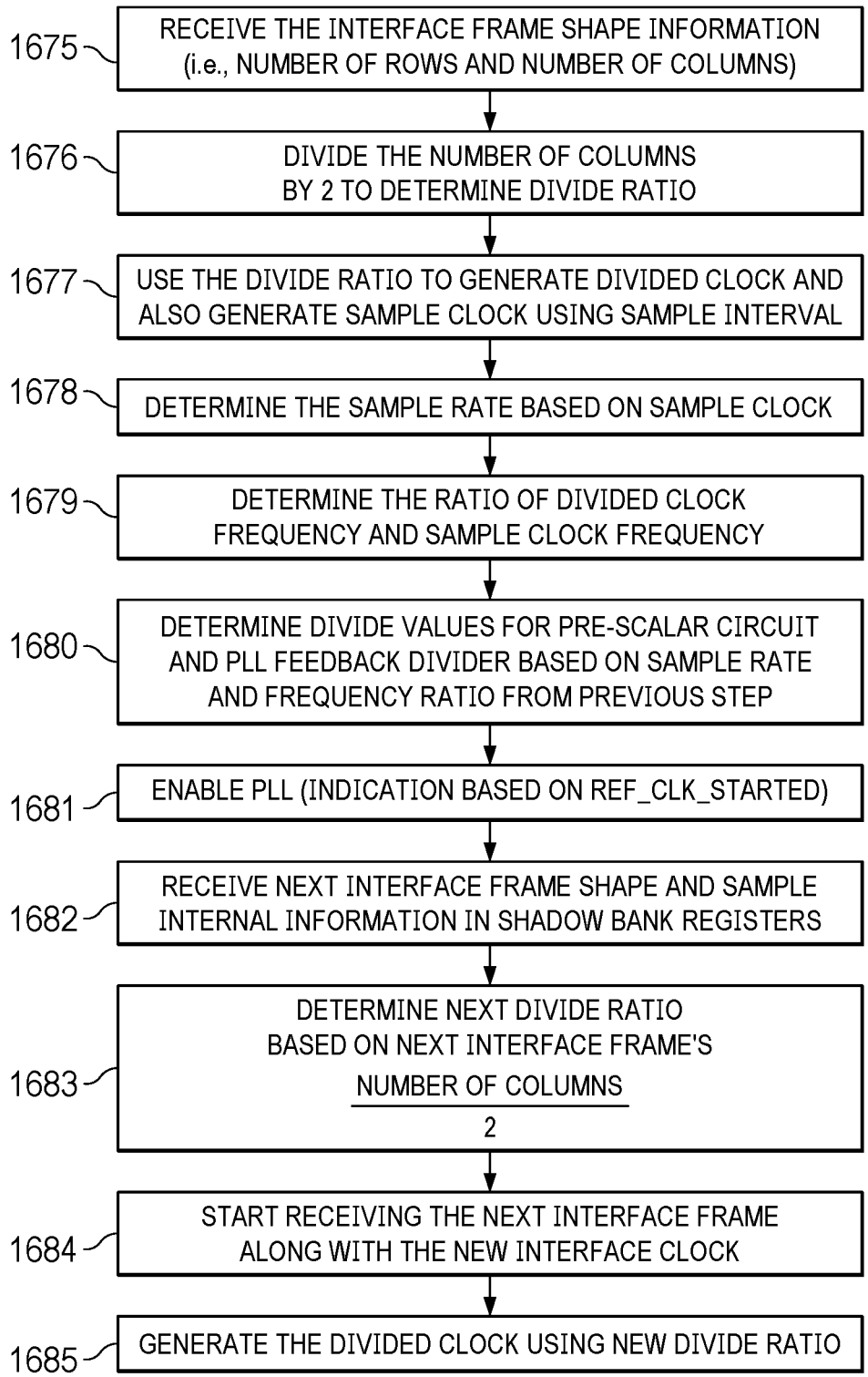
FIG. 16B is a flow diagram illustrating an example method of operation of the peripheral device of FIG. 16A.

FIG. 16B is a flow diagram illustrating the operation of the peripheral device 1649 of FIG. 16A. The flow diagram of FIG. 16B includes steps 1675-1685. At block 1675, the frame control register 730 receives the interface frame shape information (number of rows and columns). At block 1676, the internal divider calculation circuit 1620 divides the column number by 2 to determine the applicable divide ratio. At block 1677, the programmable clock divider circuit 1672 uses the divide ratio to generate the divided clock CLK_DIV. The sample clock is also generated. At block 1678, the sample rate is determined based on the sample clock. At block 1679, the ratio calculation circuit 1650 determines the frequency ratio 1651 of the divided clock frequency to the sample clock frequency. At block 1680, the PLL dividers calculation circuit 1660 determines the divide values for the pre-scalar circuit 782 and the PLL feedback divider based on the sample rate and the frequency ratio. The PLL 154 is enabled at block 1681.

At block 1682, the next interface frame shape and sample interval information is received in the shadow bank registers. At block 1683, the next divide ratio is determined based on the next interface shape (e.g., next number of columns divided by 2)). At block 1684, the next interface frame starts along with the new interface clock frequency. At block 1685, the divided clock is generated using the new divide ratio.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter or, if the parameter is zero, a reasonable range of values around zero.

Modifications are possible in the described embodiments, and other embodiments are possible, within the scope of the claims.

What is claimed is:

1. A device, comprising:
a phase-locked loop (PLL) having a reference input;
a storage element; and
a reference clock generator having an interface clock input, a reference clock output, and a programmable clock divider, the reference clock generator coupled to the storage element, the reference clock output coupled to the reference input, and the reference clock generator configured to change a divide ratio for the programmable clock divider based on a value in the storage element such that a frequency of a first clock signal at the reference clock output remains unchanged when a frequency of a second clock signal at the interface clock input changes.

2. The device of claim 1, wherein:
the storage element is configured to store a row value and a column value of a interface frame; and
the reference clock generator includes a mode selection circuit configured to determine that a first ratio of a product of the row and column values to a product of two and a divide ratio of the programmable clock divider is an integer.

3. The device of claim 2, wherein the interface frame includes audio data.

4. The device of claim 2, wherein:
the storage element is configured to store a clock scaling factor; and
upon determining that the first ratio is an integer, the reference clock generator is configured to select a divide ratio for the programmable clock divider corresponding to the clock scaling factor.

5. The device of claim 1, wherein:
the storage element is configured to store a column number of an interface frame; and
the reference clock generator is configured to change the divide ratio for the programmable clock divider to a value of one-half the column number.

6. The device of claim 5, wherein the device is configured to receive audio data at an audio frame rate, the audio frame rate being less than a frequency of the interface clock; and the device comprises:
a sample clock generator configured to generate a sample clock having a frequency equal to the audio frame rate; and
a sample rate detection circuit configured to determine a value indicative of the frequency of the sample clock.

7. The device of claim 6, wherein the PLL includes a PLL frequency divider, and the device further comprises:
a ratio calculation circuit configured to determine a first ratio of the frequency of the reference clock output to the frequency of the sample clock; and
a PLL divider calculation circuit configured to determine a PLL divide ratio for PLL frequency divider based on the first ratio and the value indicative of the frequency of the sample clock.

8. A system, comprising:
a first device having a data/control output and a clock output, the first device configured to provide control information of interface frames on the data/control output and to provide a variable frequency interface clock on the clock output; and
a second device having a data/control input and a clock input, the data/control input coupled to the data/control output and the clock input coupled to the clock output, the second device having a phase-locked loop (PLL) having a PLL reference input, and the second device configured to generate a constant frequency PLL reference clock for the PLL reference input based on the variable frequency interface clock.

9. The system of claim 8, wherein the second device comprises a programmable clock divider configured to divide the variable frequency clock by a programmable divide ratio.

10. The system of claim 9, wherein:
the first device is configured to provide a row value and a column value of the interface frame on the data/control output; and
the second device comprises:
a storage element configured to store the row and column values; and
a reference clock generator coupled to the storage element, the reference clock generator includes a mode selection circuit configured to determine that a ratio of a product of the row and column values to a divide ratio of the programmable clock divider is an integer.

11. The system of claim 10, wherein the mode selection circuit configured to determine that the ratio of a product of the row and column values to a product of two and the divide ratio of the programmable clock divider is an integer.

12. The system of claim 10, wherein:
the storage element is configured to store a clock scaling factor provided by the first device; and
upon determining that the ratio is an integer, the reference clock generator is configured to select a divide ratio for the programmable clock divider corresponding to the clock scaling factor.

13. The system of claim 9, wherein:
the second device includes a storage element configured to store a column number of the interface frame provided by the first device; and
the second device is configured to change the programmable divide ratio for the programmable clock divider to a value of one-half the column number.

14. The system of claim 13, wherein:
the first device is configured to provide audio frames at an audio frame rate that is lower than a frequency of the variable interface clock; and
the second device includes:
a sample clock generator configured to generate a sample clock having a frequency equal to the audio frame rate; and
a sample rate detection circuit configured to determine a value indicative of the frequency of the sample clock.

15. The device of claim 14, wherein the PLL includes a PLL frequency divider, and the second further comprises:
a ratio calculation circuit configured to determine a ratio of the frequency of the reference clock output to the frequency of the sample clock; and
a PLL divider calculation circuit configured to determine a PLL divide ratio for PLL frequency divider based on the ratio of the frequency of the reference clock output to the frequency of the sample clock and based on the value indicative of the frequency of the sample clock.

16. A method, comprising:
receiving an interface clock at a first frequency;
receiving a first value into a storage element;
determining a first divide ratio for the interface clock at the first frequency based on the first value;
dividing the interface clock's first frequency by the first divide ratio to produce a reference clock for a phase-locked loop (PLL);
receiving a second value into the storage element;
determining a second divide ratio for the interface clock at the second frequency based on the second value;
receiving the interface clock at a second frequency; and
dividing the interface clock's second frequency by the second divide ratio to produce the reference clock for the phase-locked loop (PLL), such that a frequency of the reference clock remains the same despite the change in the frequency of the interface clock.

17. The method of claim 16, wherein:
receiving the first value comprises receiving first values that include a row value and a column value of an interface frame; and
determining the first divide ratio comprises determining that a ratio of a product of the row and column values to a product of two and a divide ratio of a clock divider is an integer.

18. The method of claim 17, further comprising:
receiving a clock scaling factor; and
upon determining that the first divide ratio is an integer, selecting a divide ratio for the clock divider corresponding to the clock scaling factor.

19. The method of claim 16, wherein the first value is a column value of an interface frame, and determining the first divide ratio comprises determining dividing the column value by 2.

20. The method claim 19, further comprising:
generating a sample clock having a frequency equal to an audio frame rate; and
determining a value indicative of the frequency of the sample clock.

* * * * *